(12) United States Patent
Light et al.

(10) Patent No.: US 8,575,032 B2
(45) Date of Patent: Nov. 5, 2013

(54) METHODS OF FORMING A PATTERN ON A SUBSTRATE

(75) Inventors: Scott L. Light, Boise, ID (US); Anton J. deVilliers, Boise, ID (US)

(73) Assignee: Micron Technology, Inc., Boise, ID (US)

(*) Notice: Subject to any disclaimer, the term of this patent is extended or adjusted under 35 U.S.C. 154(b) by 15 days.

(21) Appl. No.: 13/101,485

(22) Filed: May 5, 2011

(65) Prior Publication Data

US 2012/0282778 A1  Nov. 8, 2012

(51) Int. Cl.
*H01L 21/311* (2006.01)

(52) U.S. Cl.
USPC .......................................................... 438/703

(58) Field of Classification Search
USPC .......................................................... 438/703
See application file for complete search history.

(56) References Cited

U.S. PATENT DOCUMENTS

| | | | |
|---|---|---|---|
| 4,910,168 A | 3/1990 | Tsai | |
| 5,008,207 A | 4/1991 | Blouse et al. | |
| 5,047,117 A | 9/1991 | Roberts | |
| 5,254,218 A | 10/1993 | Roberts et al. | |
| 5,328,810 A | 7/1994 | Lowrey et al. | |
| 5,372,916 A | 12/1994 | Ogawa et al. | |
| 5,382,315 A | 1/1995 | Kumar | |
| 5,420,067 A | 5/1995 | Hsu | |
| 5,429,988 A | 7/1995 | Huang et al. | |
| 5,573,837 A | 11/1996 | Roberts et al. | |
| 5,593,813 A | 1/1997 | Kim | |
| 5,616,510 A | 4/1997 | Wong | |
| 5,905,279 A | 5/1999 | Nitayama et al. | |
| 6,063,688 A | 5/2000 | Doyle et al. | |
| 6,087,263 A | 7/2000 | Clampitt et al. | |
| 6,140,217 A | 10/2000 | Jones et al. | |
| 6,207,490 B1 | 3/2001 | Lee | |
| 6,235,574 B1 | 5/2001 | Tobben et al. | |
| 6,249,335 B1 | 6/2001 | Hirukawa et al. | |
| 6,303,272 B1 | 10/2001 | Furukawa et al. | |
| 6,352,932 B1 | 3/2002 | Clampitt et al. | |
| 6,383,952 B1 | 5/2002 | Subramanian et al. | |
| 6,429,123 B1 | 8/2002 | Tseng | |

(Continued)

FOREIGN PATENT DOCUMENTS

| | | |
|---|---|---|
| CN | 1550889 | 12/2004 |
| CN | 1752844 | 3/2006 |

(Continued)

OTHER PUBLICATIONS

Clariant, Polysilazane SODs Spinful 400 Series for STI/PMD Application; Oct. 19, 2009; 1 pp.

(Continued)

*Primary Examiner* — Shaun Campbell
(74) *Attorney, Agent, or Firm* — Wells St. John, P.S.

(57) ABSTRACT

A method of forming a pattern on a substrate includes forming a repeating pattern of four first lines elevationally over an underlying substrate. A repeating pattern of four second lines is formed elevationally over and crossing the repeating pattern of four first lines. First alternating of the four second lines are removed from being received over the first lines. After the first alternating of the four second lines have been removed, elevationally exposed portions of alternating of the four first lines are removed to the underlying substrate using a remaining second alternating of the four second lines as a mask. Additional embodiments are disclosed and contemplated.

35 Claims, 19 Drawing Sheets

(56) References Cited

U.S. PATENT DOCUMENTS

| | | |
|---|---|---|
| 6,483,136 B1 | 11/2002 | Yoshida et al. |
| 6,545,904 B2 | 4/2003 | Tran |
| 6,548,385 B1 | 4/2003 | Lai |
| 6,548,401 B1 | 4/2003 | Trivedi |
| 6,566,280 B1 | 5/2003 | Meagley et al. |
| 6,580,136 B2 | 6/2003 | Mandelman et al. |
| 6,599,844 B2 | 7/2003 | Koh et al. |
| 6,605,541 B1 | 8/2003 | Yu |
| 6,627,524 B2 | 9/2003 | Scott |
| 6,630,379 B2 | 10/2003 | Mandelman et al. |
| 6,638,441 B2 | 10/2003 | Chang et al. |
| 6,649,956 B2 | 11/2003 | Yoshida et al. |
| 6,667,502 B1 | 12/2003 | Agarwal et al. |
| 6,703,323 B2 | 3/2004 | Kong et al. |
| 6,710,390 B2 | 3/2004 | Parekh et al. |
| 6,735,132 B2 | 5/2004 | Siek |
| 6,753,220 B2 | 6/2004 | Juengling |
| 6,756,619 B2 | 6/2004 | Tran |
| 6,811,817 B2 | 11/2004 | Sugeta et al. |
| 6,826,069 B2 | 11/2004 | Kurjanowicz et al. |
| 6,864,184 B1 | 3/2005 | Gabriel |
| 6,872,512 B2 | 3/2005 | Yamashita |
| 6,893,972 B2 | 5/2005 | Rottstegge et al. |
| 6,905,975 B2 | 6/2005 | Boettiger et al. |
| 6,916,594 B2 | 7/2005 | Bok et al. |
| 6,951,822 B2 | 10/2005 | Scholz |
| 7,023,069 B2 | 4/2006 | Blanchard |
| 7,037,840 B2 | 5/2006 | Katz |
| 7,042,038 B2 | 5/2006 | Yoshida et al. |
| 7,049,652 B2 | 5/2006 | Mokhlesi et al. |
| 7,064,376 B2 | 6/2006 | Shau |
| 7,067,385 B2 | 6/2006 | Manning |
| 7,098,105 B2 | 8/2006 | Juengling |
| 7,115,525 B2 | 10/2006 | Abatchev et al. |
| 7,125,781 B2 | 10/2006 | Manning et al. |
| 7,151,040 B2 | 12/2006 | Tran et al. |
| 7,166,533 B2 | 1/2007 | Happ |
| 7,199,005 B2 | 4/2007 | Sandhu et al. |
| 7,202,127 B2 | 4/2007 | Musch et al. |
| 7,202,174 B1 | 4/2007 | Jung et al. |
| 7,230,292 B2 | 6/2007 | Graettinger |
| 7,253,118 B2 | 8/2007 | Tran et al. |
| 7,265,059 B2 | 9/2007 | Rao et al. |
| 7,314,810 B2 | 1/2008 | Jung et al. |
| 7,320,911 B2 | 1/2008 | Basceri et al. |
| 7,339,252 B2 | 3/2008 | Blanchard |
| 7,361,609 B2 | 4/2008 | Hah et al. |
| 7,387,939 B2 | 6/2008 | Manning |
| 7,390,749 B2 | 6/2008 | Kim et al. |
| 7,396,781 B2 | 7/2008 | Wells |
| 7,439,152 B2 | 10/2008 | Manning |
| 7,442,976 B2 | 10/2008 | Juengling |
| 7,517,753 B2 | 4/2009 | Manning |
| 7,521,371 B2 | 4/2009 | DeBruler |
| 7,521,378 B2 | 4/2009 | Fucsko et al. |
| 7,524,607 B2 | 4/2009 | Ho et al. |
| 7,537,866 B2 | 5/2009 | King Liu |
| 7,544,563 B2 | 6/2009 | Manning |
| 7,553,760 B2 | 6/2009 | Yang et al. |
| 7,557,013 B2 | 7/2009 | Bhat et al. |
| 7,557,015 B2 | 7/2009 | Sandhu et al. |
| 7,582,412 B2 | 9/2009 | Cameron et al. |
| 7,682,924 B2 | 3/2010 | Bhat et al. |
| 7,687,387 B2 | 3/2010 | Inaba et al. |
| 7,696,076 B2 | 4/2010 | Jung et al. |
| 7,713,818 B2 | 5/2010 | Chan |
| 7,754,591 B2 | 7/2010 | Jung |
| 7,790,357 B2 | 9/2010 | Jung |
| 7,790,360 B2 | 9/2010 | Alapati et al. |
| 7,842,601 B2 | 11/2010 | Lee et al. |
| 7,846,646 B2 | 12/2010 | Kamijima |
| 7,851,135 B2 | 12/2010 | Jung et al. |
| 7,855,038 B2 | 12/2010 | Hah et al. |
| 7,923,371 B2 | 4/2011 | Shinohe |
| 8,083,953 B2 | 12/2011 | Millward et al. |
| 8,083,958 B2 | 12/2011 | Li et al. |
| 8,148,052 B2 | 4/2012 | Vanleenhove et al. |
| 2002/0037617 A1 | 3/2002 | Kim et al. |
| 2002/0043690 A1 | 4/2002 | Doyle et al. |
| 2002/0094688 A1 | 7/2002 | Mitsuiki |
| 2003/0001214 A1 | 1/2003 | Yoshida et al. |
| 2003/0006410 A1 | 1/2003 | Doyle |
| 2003/0008968 A1 | 1/2003 | Sugeta et al. |
| 2003/0091936 A1 | 5/2003 | Rottstegge et al. |
| 2003/0096903 A1 | 5/2003 | Sugeta et al. |
| 2004/0043546 A1 | 3/2004 | Yoshida et al. |
| 2004/0198065 A1 | 10/2004 | Lee et al. |
| 2004/0253535 A1 | 12/2004 | Cameron et al. |
| 2005/0058950 A1 | 3/2005 | Sugeta et al. |
| 2005/0130068 A1 | 6/2005 | Kondoh et al. |
| 2005/0142497 A1 | 6/2005 | Ryou et al. |
| 2005/0164478 A1 | 7/2005 | Chan et al. |
| 2005/0173740 A1 | 8/2005 | Jin |
| 2005/0214683 A1 | 9/2005 | Nishimura et al. |
| 2005/0255696 A1 | 11/2005 | Makiyama et al. |
| 2005/0272220 A1 | 12/2005 | Waldfried et al. |
| 2006/0011947 A1 | 1/2006 | Juengling |
| 2006/0024621 A1 | 2/2006 | Nolscher et al. |
| 2006/0046200 A1 | 3/2006 | Abatchev et al. |
| 2006/0046422 A1 | 3/2006 | Tran et al. |
| 2006/0046484 A1 | 3/2006 | Abatchev et al. |
| 2006/0063384 A1 | 3/2006 | Hah et al. |
| 2006/0088788 A1 | 4/2006 | Kudo et al. |
| 2006/0099347 A1 | 5/2006 | Sugeta et al. |
| 2006/0115978 A1 | 6/2006 | Specht et al. |
| 2006/0118785 A1 | 6/2006 | Allen et al. |
| 2006/0154182 A1 | 7/2006 | Brodsky |
| 2006/0240361 A1 | 10/2006 | Lee et al. |
| 2006/0262511 A1 | 11/2006 | Abatchev et al. |
| 2006/0263699 A1* | 11/2006 | Abatchev et al. ............... 430/5 |
| 2006/0273456 A1 | 12/2006 | Sant et al. |
| 2006/0278911 A1 | 12/2006 | Eppich |
| 2006/0286795 A1 | 12/2006 | Yosho |
| 2007/0003878 A1 | 1/2007 | Paxton et al. |
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1 | 2/2007 | Parascandola et al. |
| 2007/0037066 A1 | 2/2007 | Hsiao |
| 2007/0045712 A1 | 3/2007 | Haller et al. |
| 2007/0048674 A1 | 3/2007 | Wells |
| 2007/0048930 A1 | 3/2007 | Figura et al. |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Tran |
| 2007/0049040 A1 | 3/2007 | Bai et al. |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schloesser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshell et al. |
| 2007/0148984 A1 | 6/2007 | Abatchev et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1 | 8/2007 | Jung |
| 2007/0205438 A1 | 9/2007 | Juengling |
| 2007/0205443 A1 | 9/2007 | Juengling |
| 2007/0224537 A1 | 9/2007 | Nozaki et al. |
| 2007/0238053 A1 | 10/2007 | Hashimoto |
| 2007/0238299 A1 | 10/2007 | Niroomand et al. |
| 2007/0248916 A1 | 10/2007 | Kamijima |
| 2007/0264828 A1 | 11/2007 | Jung et al. |
| 2007/0264830 A1 | 11/2007 | Huang et al. |
| 2007/0278183 A1 | 12/2007 | Lee et al. |
| 2007/0281219 A1 | 12/2007 | Sandhu |
| 2007/0281488 A1 | 12/2007 | Wells et al. |
| 2007/0281493 A1 | 12/2007 | Fucsko et al. |

(56) References Cited

U.S. PATENT DOCUMENTS

| | | |
|---|---|---|
| 2008/0002475 A1 | 1/2008 | Yang et al. |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1 | 2/2008 | Nozaki et al. |
| 2008/0057692 A1 | 3/2008 | Wells et al. |
| 2008/0063986 A1 | 3/2008 | Jung |
| 2008/0064213 A1 | 3/2008 | Jung |
| 2008/0070165 A1 | 3/2008 | Fischer et al. |
| 2008/0076070 A1 | 3/2008 | Koh et al. |
| 2008/0085612 A1 | 4/2008 | Smythe et al. |
| 2008/0090416 A1 | 4/2008 | Raghu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1 | 7/2008 | Hah et al. |
| 2008/0176406 A1 | 7/2008 | Ikeda et al. |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0210900 A1 | 9/2008 | Wojtczak et al. |
| 2008/0220600 A1 | 9/2008 | Alapati et al. |
| 2008/0254627 A1 | 10/2008 | Wells |
| 2008/0261349 A1 | 10/2008 | Abatchev et al. |
| 2008/0292991 A1 | 11/2008 | Wallow et al. |
| 2008/0296732 A1 | 12/2008 | Olson |
| 2008/0305636 A1 | 12/2008 | Kim et al. |
| 2009/0074958 A1 | 3/2009 | Xiao |
| 2009/0108415 A1 | 4/2009 | Lenski et al. |
| 2009/0130601 A1 | 5/2009 | Jeon |
| 2009/0130612 A1 | 5/2009 | Yang |
| 2009/0130852 A1 | 5/2009 | Kewley |
| 2009/0212016 A1 | 8/2009 | Cheng et al. |
| 2009/0291397 A1 | 11/2009 | deVilliers |
| 2009/0298274 A1 | 12/2009 | Kajiware |
| 2010/0009512 A1 | 1/2010 | Fishburn |
| 2010/0021573 A1 | 1/2010 | Gonzalez et al. |
| 2010/0028809 A1 | 2/2010 | Vanleenhove et al. |
| 2010/0040980 A1 | 2/2010 | Nishimura et al. |
| 2010/0068656 A1 | 3/2010 | Yeh et al. |
| 2010/0081265 A1 | 4/2010 | Mashita et al. |
| 2010/0130015 A1 | 5/2010 | Nakajima et al. |
| 2010/0130016 A1 | 5/2010 | deVilliers |
| 2010/0144150 A1 | 6/2010 | Sills et al. |
| 2010/0144151 A1 | 6/2010 | Sills et al. |
| 2010/0144153 A1 | 6/2010 | Sills et al. |
| 2010/0203740 A1 | 8/2010 | Li |
| 2011/0018055 A1 | 1/2011 | Ohta et al. |
| 2011/0127677 A1 | 6/2011 | Konishi |

FOREIGN PATENT DOCUMENTS

| | | |
|---|---|---|
| CN | 1761063 | 4/2006 |
| CN | 101026087 | 8/2007 |
| CN | 101145515 | 3/2008 |
| CN | 200980148546.9 | 11/2012 |
| CN | 200980148548.8 | 2/2013 |
| CN | 200980148590.X | 2/2013 |
| EP | 0171111 | 2/1986 |
| EP | 1273974 A2 | 1/2003 |
| EP | 09830819 | 3/2013 |
| EP | 10756541 | 5/2013 |
| JP | 56046531 | 4/1981 |
| JP | 58157135 | 9/1983 |
| JP | 59211231 | 11/1984 |
| JP | 64035916 | 3/1989 |
| JP | 1292829 | 11/1989 |
| JP | 3270227 | 12/1991 |
| JP | 06-077180 | 3/1994 |
| JP | 6275577 | 9/1994 |
| JP | 2002-217170 | 8/2002 |
| JP | 2003234279 | 8/2003 |
| JP | 2004134574 | 4/2004 |
| JP | 2004247399 | 9/2004 |
| JP | 2005-243681 | 9/2005 |
| JP | 2006245625 | 9/2006 |
| JP | 2007017993 | 1/2007 |
| JP | 2007-294511 | 11/2007 |
| JP | 2007305976 | 11/2007 |
| JP | 2008-072097 | 3/2008 |
| JP | 2008072101 | 3/2008 |
| JP | 2009-0289974 | 12/2009 |
| KR | 20030049198 | 6/2003 |
| KR | 20030056601 | 7/2003 |
| KR | 20030089063 | 11/2003 |
| KR | 10-2004-0016678 | 2/2004 |
| KR | 4025289 | 3/2004 |
| KR | 20040057582 | 7/2004 |
| KR | 10-2007-0076793 | 7/2007 |
| KR | 10-2007-0122049 | 12/2007 |
| KR | 10-0784062 | 12/2007 |
| KR | 10-2008-0039006 | 5/2008 |
| KR | 20080038963 | 5/2008 |
| TW | 098113229 | 9/2012 |
| TW | 098139941 | 12/2012 |
| TW | 098139943 | 12/2012 |
| WO | WO2007/027558 | 3/2007 |
| WO | PCT/US2007/015729 | 1/2008 |
| WO | WO 2008/008338 | 1/2008 |
| WO | WO 2008/059440 | 5/2008 |
| WO | PCT/US2009/039793 | 10/2009 |
| WO | PCT/US2009/041500 | 12/2009 |
| WO | PCT/US2009/063978 | 5/2010 |
| WO | PCT/US2009/063999 | 5/2010 |
| WO | PCT/US2009/064004 | 5/2010 |
| WO | PCT/US2010/025495 | 9/2010 |
| WO | PCT/US2009/039793 | 11/2010 |
| WO | PCT/US2009/041500 | 12/2010 |
| WO | PCT/US2009/063978 | 6/2011 |
| WO | PCT/US2009/063999 | 6/2011 |
| WO | PCT/US2009/064004 | 6/2011 |
| WO | PCT/US2010/055488 | 6/2011 |
| WO | PCT/US2010/025495 | 9/2011 |

OTHER PUBLICATIONS

Ee et al., "Innovative Solutions to Enhance the Legacy Equipments Towards One Generation Ahead in Flip Chip BGA 0.8mm Ball Pitch Technology", Sep. 2005; 4 pp.

Fritze et al., "Enhanced Resosulation for Future Fabrication", Jan. 2003, 5 pp.

Gallia et al., "A Flexible Gate Array Architecture for High-speed and High-Density Applications", Mar. 1996, pp. 430-436.

Hori et al., "Sub-40nm Half-Pitch Double Patterning with Resist Freezing Process", 2008 8 pp.

Lee et al., "Double-Patterning Technique Using Plasma Treatment of Photoresist", Sep. 20, 2007, 5 pp.

Liau et al., "Softbake and Post-exposure Bake Optimization for Process Window Improvement and Optical Proximity Effect Tuning", 2006, 7 pp.

Lu, "Advanced Cell Structures for Dynamic RAMs", Jan. 1989, pp. 27-36.

Ma, "Plasma Resist Image Stabilization Technique (PRIST)", 1980, 2 pp.

Owa et al., "Immersion Lithography Ready for 45nm Manufacturing and Beyond", 2007, pp. 238-244.

Pease et al., "Lithography and Other Patterning Techniques for Future Electronics", Feb. 2008, pp. 248-270.

Tan et al., "Current Status of Nanonex Nanoimprint Solutions", 2004, 9 pp.

Terai et al., "Newly developed RELACS Process and materials for 64 nm node device and beyond", pp. 20-21.

U.S. Appl. No. 11/714,378, filed Mar. 5, 2007, Preliminary Amendment, 13 pp.

* cited by examiner

METHODS OF FORMING A PATTERN ON A SUBSTRATE

TECHNICAL FIELD

Embodiments disclosed herein pertain to methods of forming patterns over substrates, for example to forming a plurality of contact openings to node locations in the fabrication of integrated circuitry.

BACKGROUND

Integrated circuits are often formed on a semiconductor substrate such as a silicon wafer or other semiconductive material. In general, layers of various materials which are semiconductive, conductive, or electrically insulative are utilized to form the integrated circuits. By way of examples, the various materials may be doped, ion implanted, deposited, etched, grown, etc. using various processes. A continuing goal in semiconductive processing is to strive to reduce the size of individual electronic components, thereby enabling smaller and denser integrated circuitry.

One technique for patterning and processing semiconductor substrates is photolithography. Such includes deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, thereby leaving a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are utilized. Further, patterns may be formed on substrates without using photoresist.

The continual reduction in feature sizes places ever greater demands on the techniques used to form the features. For example, photolithography is commonly used to form patterned features, such as conductive lines and arrays of contact openings to underlying circuitry. A concept commonly referred to as "pitch" can be used to describe the sizes of the repeating features in conjunction with spaces immediately adjacent thereto. Pitch may be defined as the distance between an identical point in two neighboring features of a repeating pattern in a straight line cross section, thereby including the maximum width of the feature and the space to the next immediately adjacent feature. However, due to factors such as optics and light or radiation wavelength, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing one or more spacer-forming layers to have a total lateral thickness which is less than that of the minimum capable photolithographic feature size. The spacer-forming layers are commonly anisotropically etched to form sub-lithographic features, and then the features which were formed at the minimum photolithographic feature size are etched from the substrate.

Using such technique where pitch is actually halved, such reduction in pitch is conventionally referred to as pitch "doubling". More generally, "pitch multiplication" encompasses increase in pitch of two or more times, and also of fractional values other than integers. Thus conventionally, "multiplication" of pitch by a certain factor actually involves reducing the pitch by that factor.

In addition to minimum feature size and placement of such features, it is often highly desirable that the features as-formed are uniform in dimension. Accordingly, uniformity when forming a plurality of features may also be of concern, and is increasingly a challenge as the minimum feature dimensions reduce.

DETAILED DESCRIPTION OF EXAMPLE EMBODIMENTS

Figure 1:
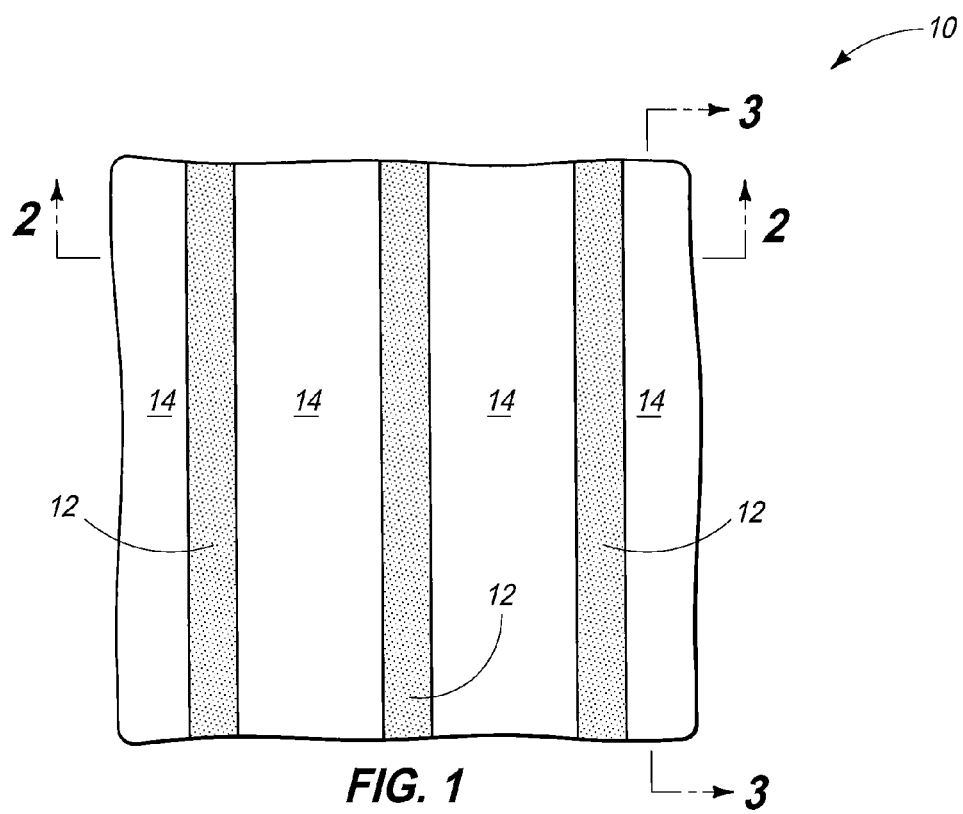
FIG. 1 is a diagrammatic top view of a substrate in process in accordance with an embodiment of the invention.
Figure 2:
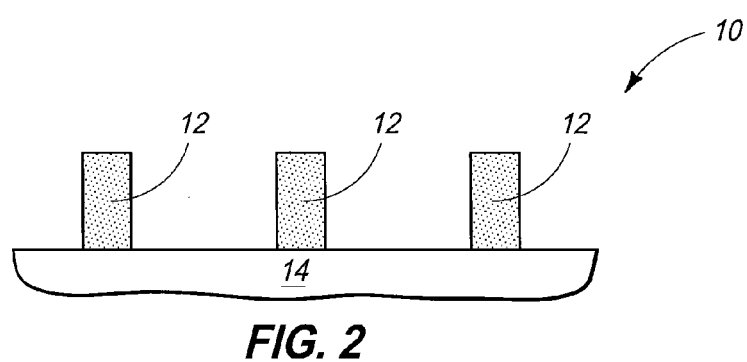
FIG. 2 is a cross sectional view taken through line 2-2 in FIG. 1.
Figure 3:
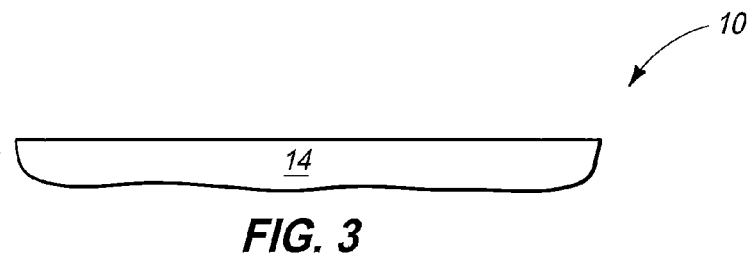
FIG. 3 is a cross sectional view taken through line 3-3 in FIG. 1.

Initial example methods of forming a pattern on a substrate are described with reference to FIGS. 1-30 with respect to a substrate fragment 10. Referring to FIGS. 1-3, longitudinally elongated first lines 12 have been formed over an underlying substrate 14. First lines 12 may be homogenous or non-homogenous, may remain or be removed at the finish of processing, and may comprise any material, whether conductive, insulative, and/or semiconductive. Such may respectively have constant lateral width or variable width, and such may be of the same or different width, sizes and shapes relative one another. Further and regardless, such may be fabricated at, above, or below minimum photolithographic feature width where photolithography may be used during fabrication. One example material for first lines 12 is photoresist.

Underlying substrate 14 may be homogenous or non-homogenous, for example comprising multiple different composition materials and/or layers. As an example, such may comprise bulk monocrystalline silicon and/or a semiconductor-on-insulator substrate. As an additional example, such may comprise dielectric material having conductive contacts or vias therein which extend vertically or otherwise into current conductive electrical connection with electronic device components, regions, or material received elevationally inward of the dielectric material. Underlying substrate 14 may or may not be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In but one example only, the description proceeds relative to fabrication of a feature pattern on a substrate having a final feature width of about the minimum lateral width of features 12. An example pitch doubling process may be used whereby space between immediately adjacent lines 12 is approximately three times the width of features 12. Regardless, first lines 12 may be or may have been subjected to a lateral trimming etch. Further and regardless, features 12 may have resulted from a pattern transfer from an overlying layer, followed by removal thereof.

Figure 4:
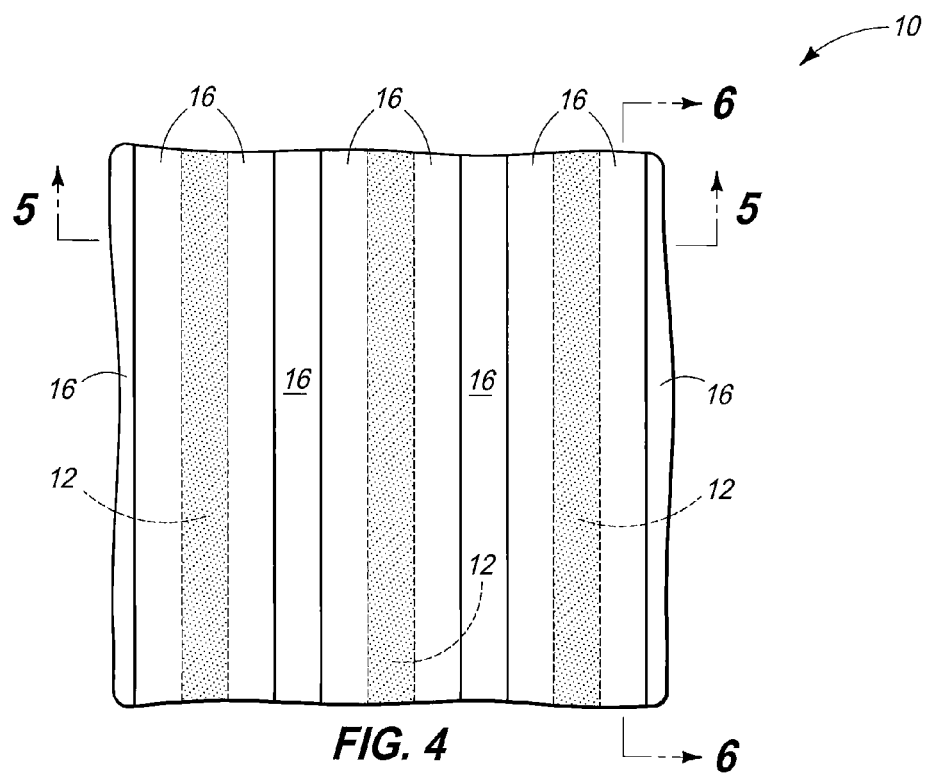
FIG. 4 is a view of the FIG. 1 substrate at a processing step subsequent to that shown by FIG. 1.
Figure 5:
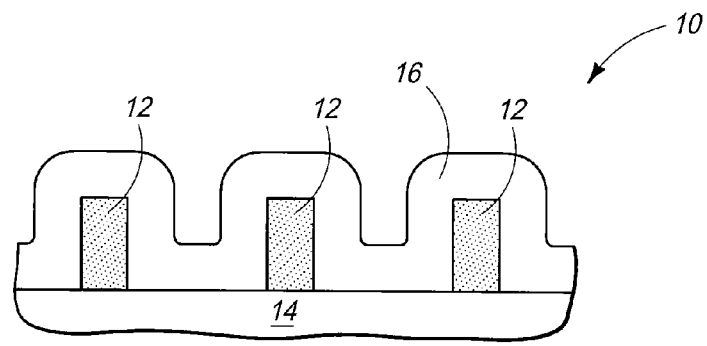
FIG. 5 is a cross sectional view taken through line 5-5 in FIG. 4.
Figure 6:
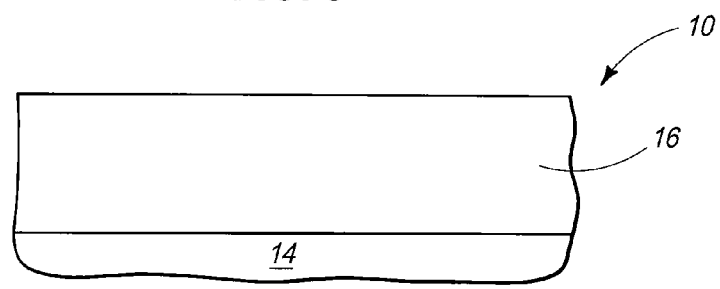
FIG. 6 is a cross sectional view taken through line 6-6 in FIG. 4.

Referring to FIGS. 4-6, a spacer-forming layer 16 has been formed over first lines 12. Such may be homogenous or non-homogenous, may be sacrificial, and may be formed by any suitable deposition technique. An example ideal technique is atomic layer deposition, and example compositions include silicon dioxide and silicon nitride. In the depicted example, spacer-forming layer 16 has been deposited to a thickness about equal to the lateral width of first lines 12.

Figure 7:
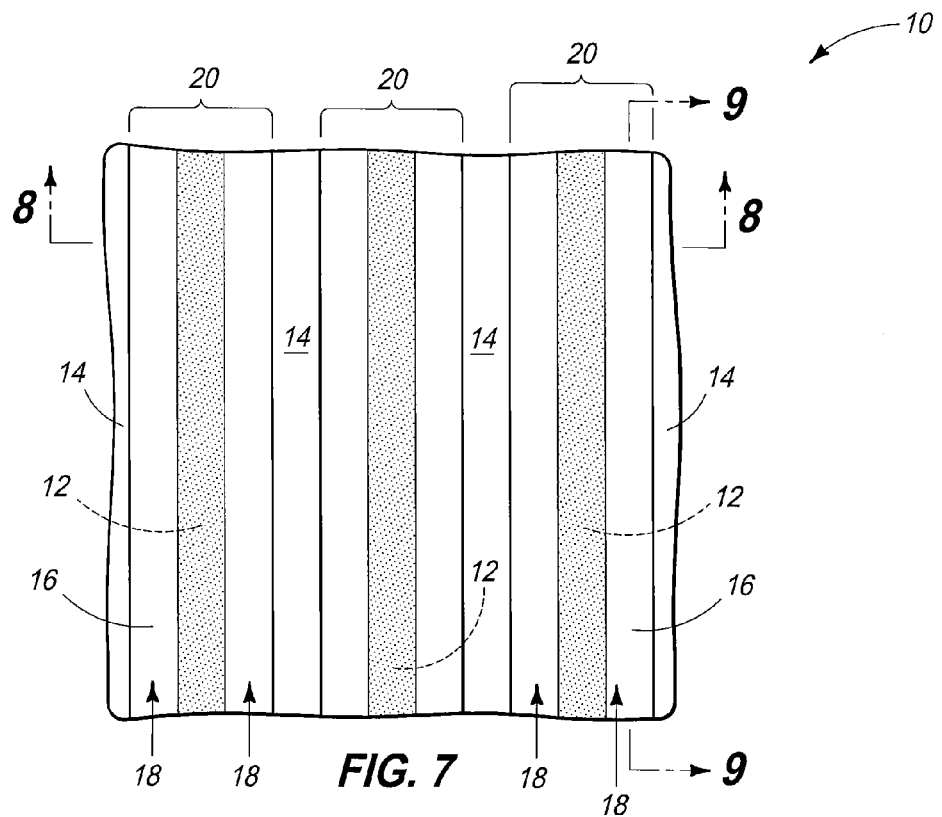
FIG. 7 is a view of the FIG. 4 substrate at a processing step subsequent to that shown by FIG. 4.
Figure 8:
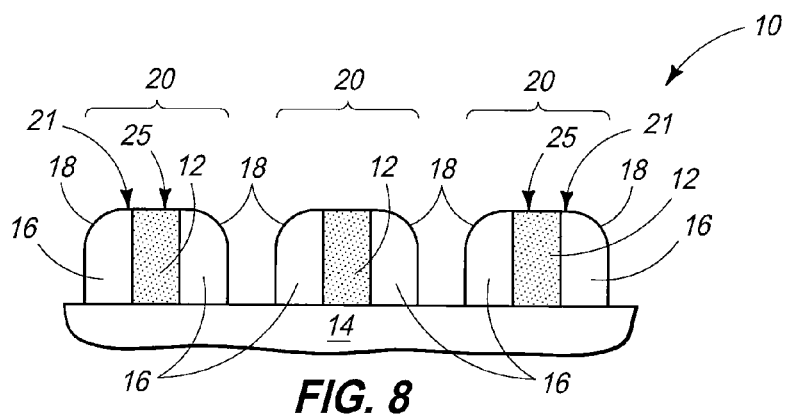
FIG. 8 is a cross sectional view taken through line 8-8 in FIG. 7.
Figure 9:
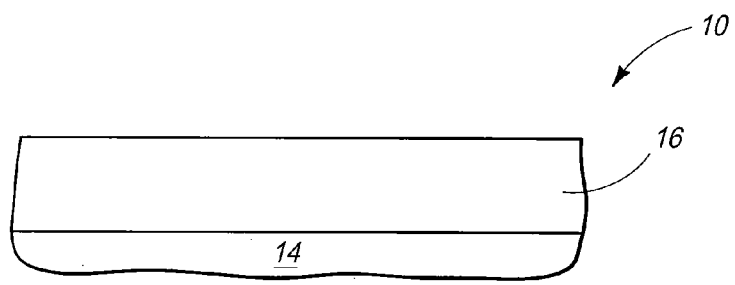
FIG. 9 is a cross sectional view taken through line 9-9 in FIG. 7.

Referring to FIGS. 7-9, spacer-forming layer 16 has been subjected to an anisotropic etch, thereby forming first sidewall spacers 18 which are received longitudinally along opposite sides of first lines 12. Such may be formed by masked and/or mask-less manner(s). Example first features 20 are thereby formed elevationally over an underlying substrate, with such first features comprising longitudinally elongated first lines having first sidewall spacers (i.e., material extending or originally formed extending from sidewalls of another material) received longitudinally along opposite sides thereof. Any alternate existing or yet-to-be-developed technique(s) may be used to form first features 20. Elevationally outermost surfaces 21 of the respective first sidewall spacers may be elevationally coincident. Elevationally outermost surfaces 25 of the respective first lines may be elevationally coincident. If the outermost surfaces of the first sidewall spacers and the first lines are respectively elevationally coincident, such may further be elevationally coincident relative each other.

Figure 10:
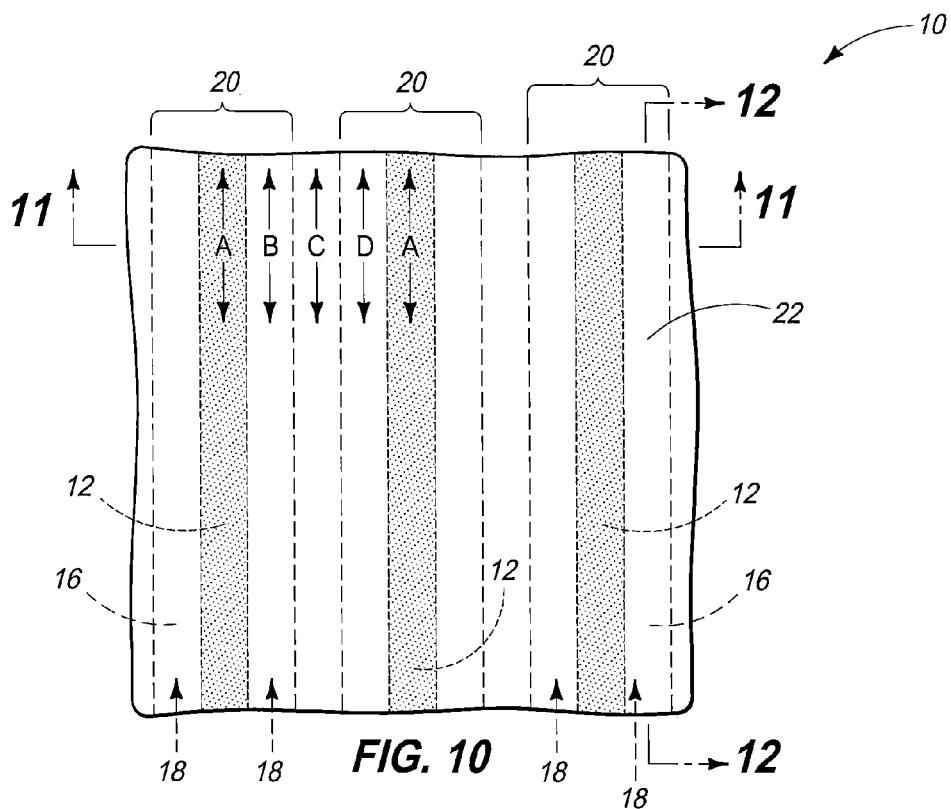
FIG. 10 is a view of the FIG. 7 substrate at a processing step subsequent to that shown by FIG. 7.
Figure 11:
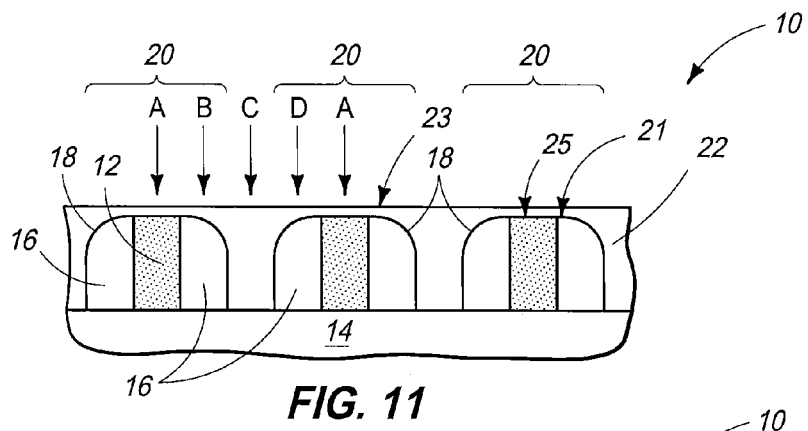
FIG. 11 is a cross sectional view taken through line 11-11 in FIG. 10.
Figure 12:
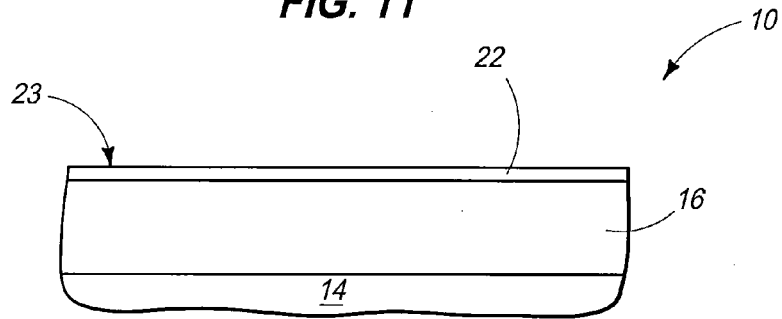
FIG. 12 is a cross sectional view taken through line 12-12 in FIG. 10.

Referring to FIGS. 10-12, first fill material 22 has been formed to be received laterally between first sidewall spacers 18 of laterally adjacent first features 20. Such may be homogenous or non-homogenous, and may be of the same composition as the material of first lines 12. Such may be organic and/or inorganic, and be deposited by any technique including liquid spin-on techniques which may inherently result in a planar elevationally outermost surface 23. By way of examples only, some suitable materials include photoresist, spin-on materials, and antireflective coatings such as DARC and BARC. The outermost surface of first fill material 22 may or may not be planar, and may be formed to be elevationally coincident with, elevationally outward of, or inwardly of outermost surfaces 21, 25 of first spacers 18 and/or first lines 12. FIGS. 10-12 depict an example wherein outermost surface 23 of first fill material 22 is elevationally outward of such surfaces of first spacers 18 and such surfaces of first lines 12.

Figure 13:
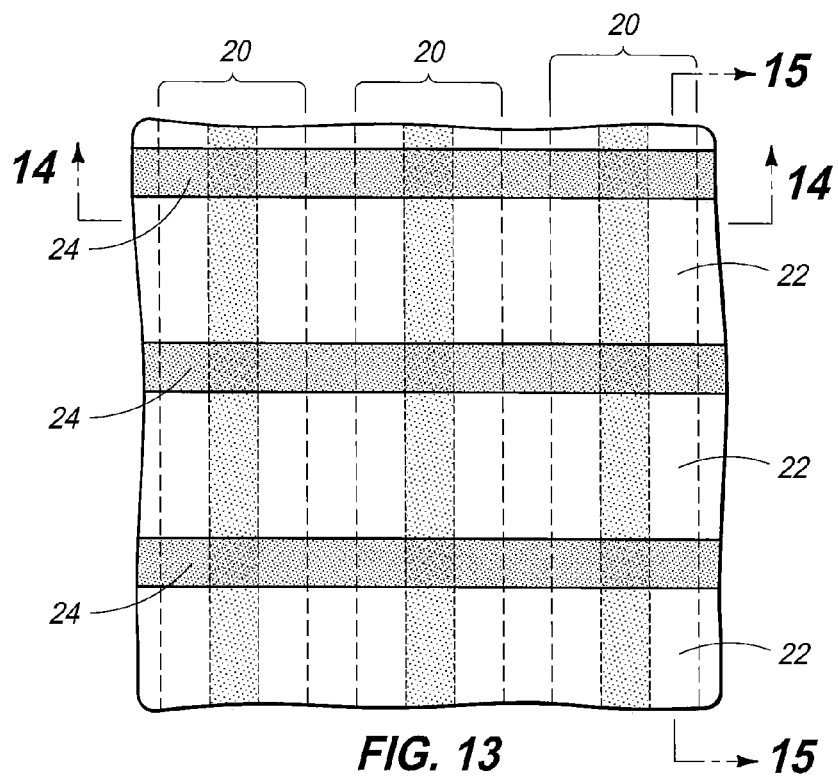
FIG. 13 is a view of the FIG. 10 substrate at a processing step subsequent to that shown by FIG. 10.
Figure 14:
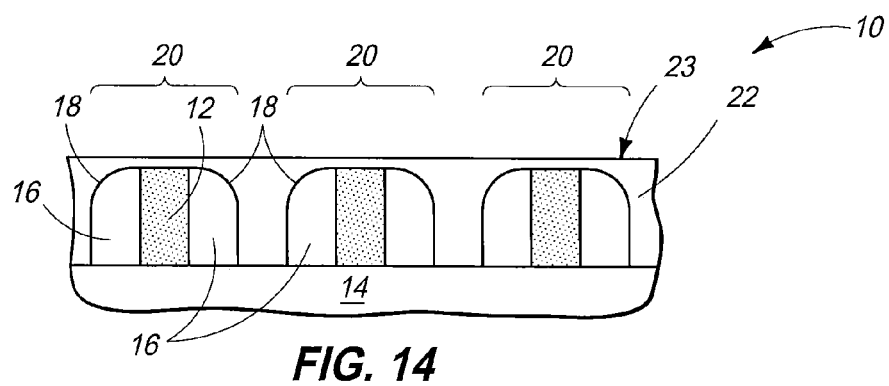
FIG. 14 is a cross sectional view taken through line 14-14 in FIG. 13.
Figure 15:
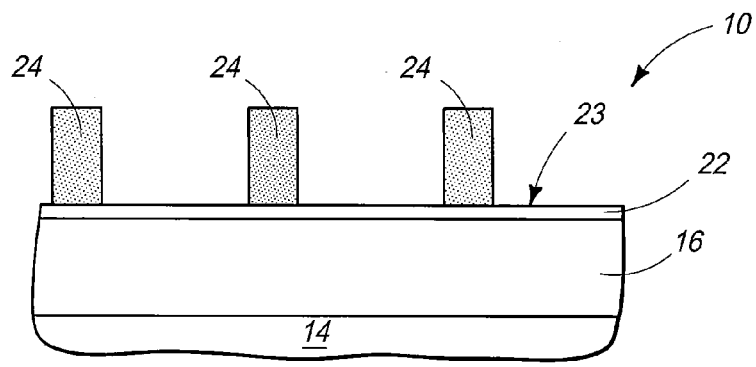
FIG. 15 is a cross sectional view taken through line 15-15 in FIG. 13.

Referring to FIGS. 13-15, longitudinally elongated second lines 24 have been formed elevationally over first fill material 22. Such may be of the same or different composition(s) as first lines 12, and formed by any of the same or different techniques as described above. In accordance with the example particular pitch-doubling process shown, such have been formed to have a maximum lateral width equal to about the final feature width, with immediately adjacent second lines 24 being separated by spaces having about three times such final feature width. Alternate sizes may be used, and the size and spacing of the first and second lines may not be the same (not shown).

Figure 16:
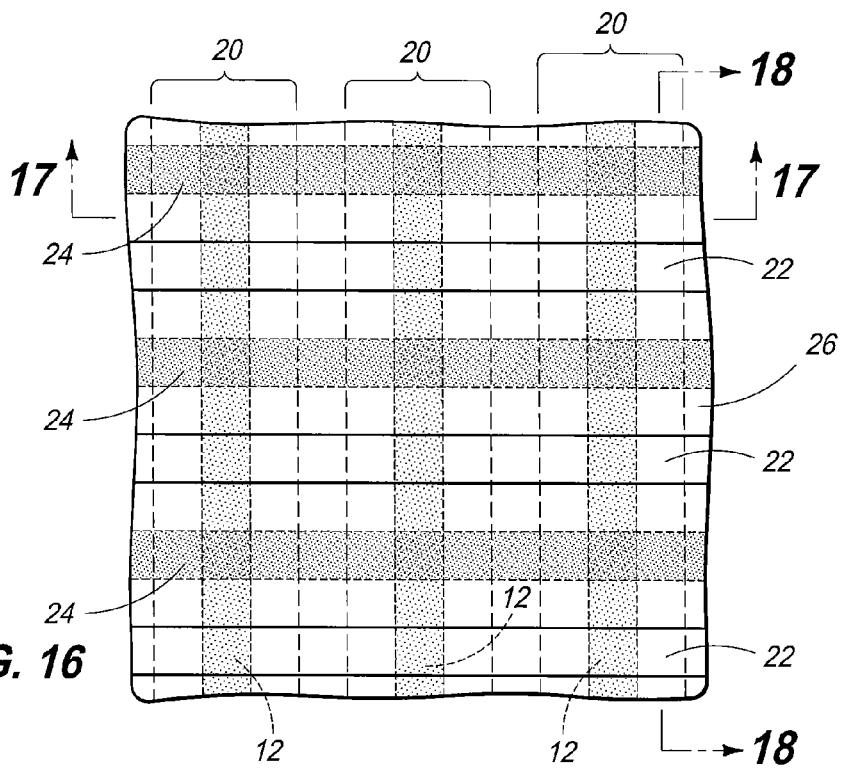
FIG. 16 is a view of the FIG. 13 substrate at a processing step subsequent to that shown by FIG. 13.
Figure 17:
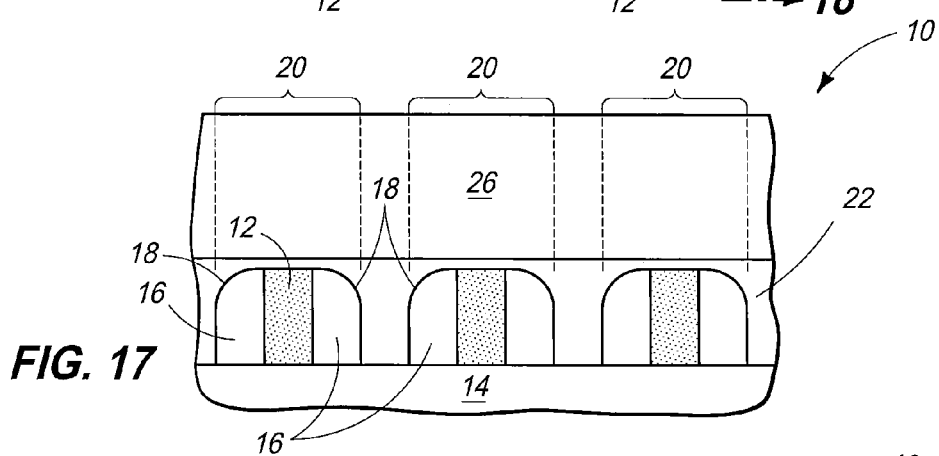
FIG. 17 is a cross sectional view taken through line 17-17 in FIG. 16.
Figure 18:
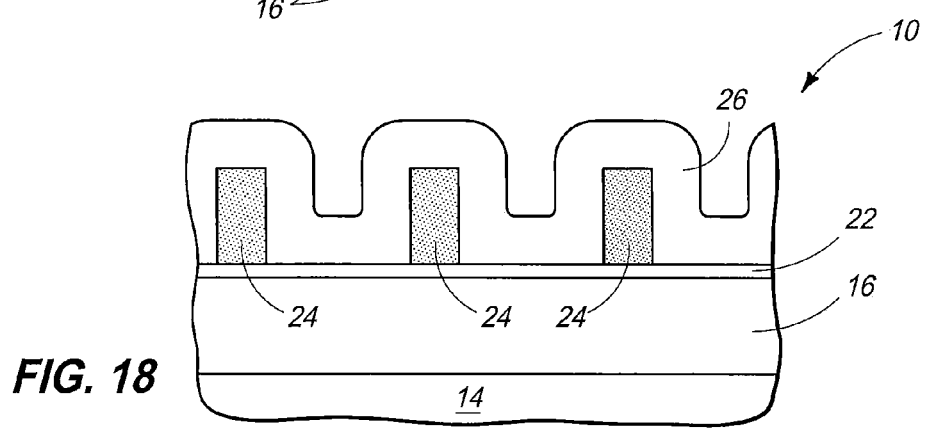
FIG. 18 is a cross sectional view taken through line 18-18 in FIG. 16.

Referring to FIGS. 16-18, another spacer-forming layer 26 has been formed over second lines 24. Such may be of the same or different composition(s) as material of first spacers 18. Such is shown as having been deposited to about the minimum final feature width, although other thicknesses may be used.

Figure 19:
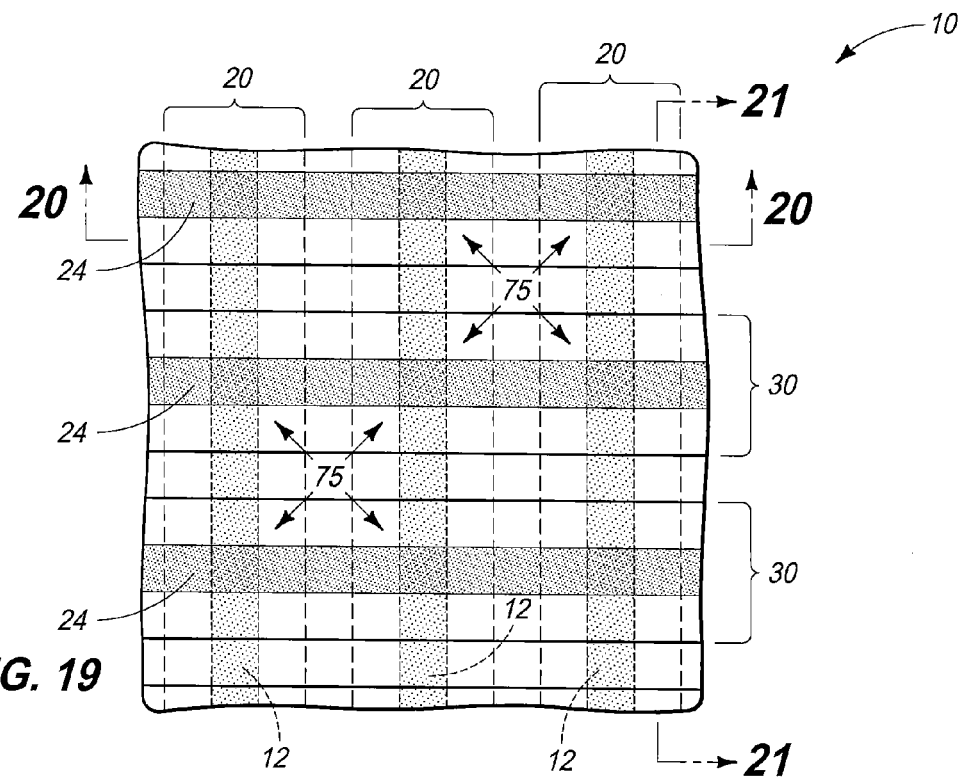
FIG. 19 is a view of the FIG. 16 substrate at a processing step subsequent to that shown by FIG. 16.
Figure 20:
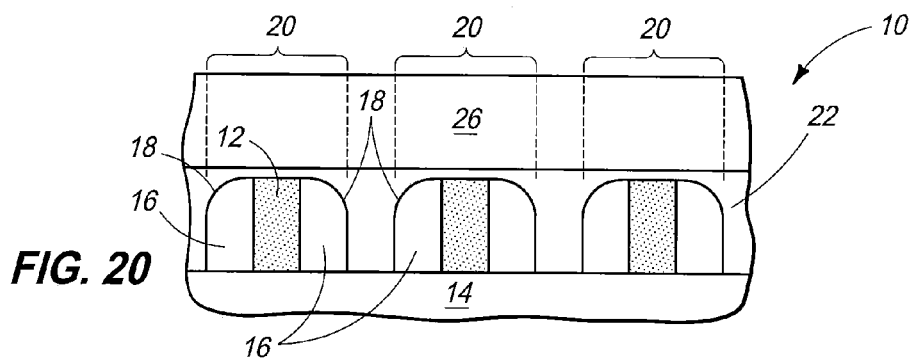
FIG. 20 is a cross sectional view taken through line 20-20 in FIG. 19.
Figure 21:
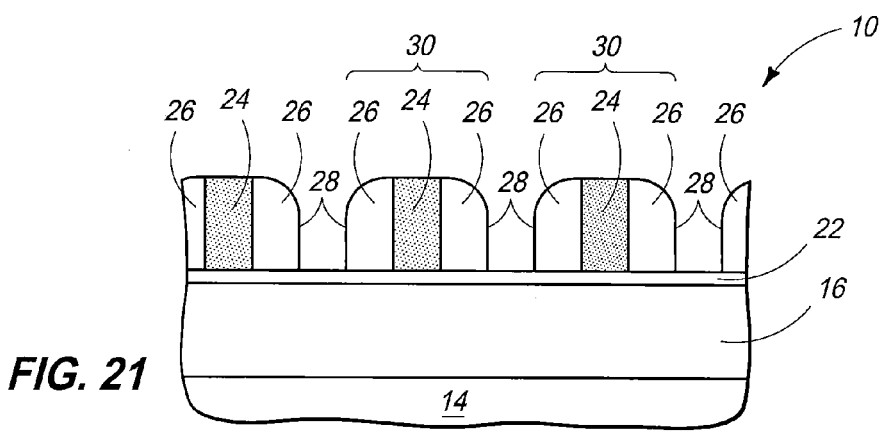
FIG. 21 is a cross sectional view taken through line 21-21 in FIG. 19.

Referring to FIGS. 19-21, spacer-forming layer 26 has been anisotropically etched to form second sidewall spacers 28 which are received longitudinally along opposite sides of second lines 24. Such may be conducted in masked and/or mask-less manner(s). Regardless, second features 30 have been formed elevationally over and crossing first features 20, with second features 30 comprising second lines 24 having sidewall spacers 28 received longitudinally along opposite sides thereof. In one embodiment and as shown, first features 20 and second features 30 cross orthogonally relative one another, although such may cross non-orthogonally. Further in the depicted example, first features 20 and second features 30 each extend longitudinally straight linear. Alternately by way of examples only, one or both of the collective first features and the collective second features may not be straight linear or respectively extend longitudinally curvilinear (not shown) regardless of whether crossing orthogonally relative one another.

Figure 22:
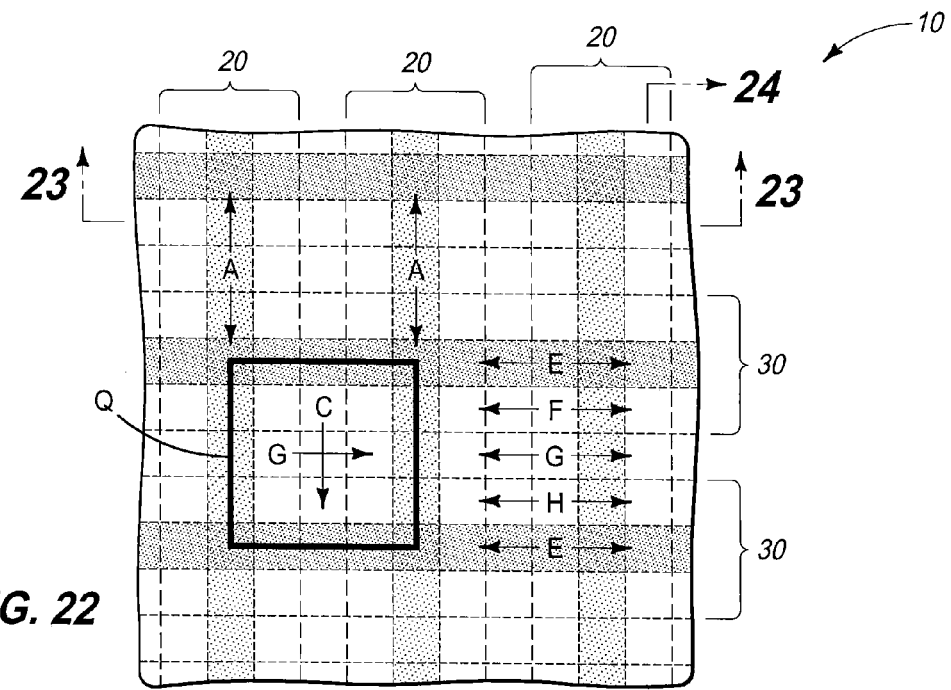
FIG. 22 is a view of the FIG. 19 substrate at a processing step subsequent to that shown by FIG. 19.
Figure 23:
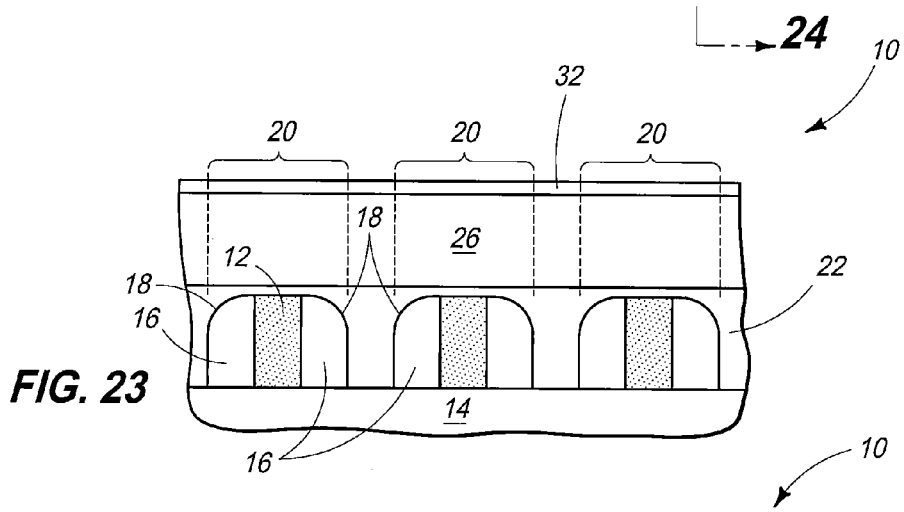
FIG. 23 is a cross sectional view taken through line 23-23 in FIG. 22.
Figure 24:
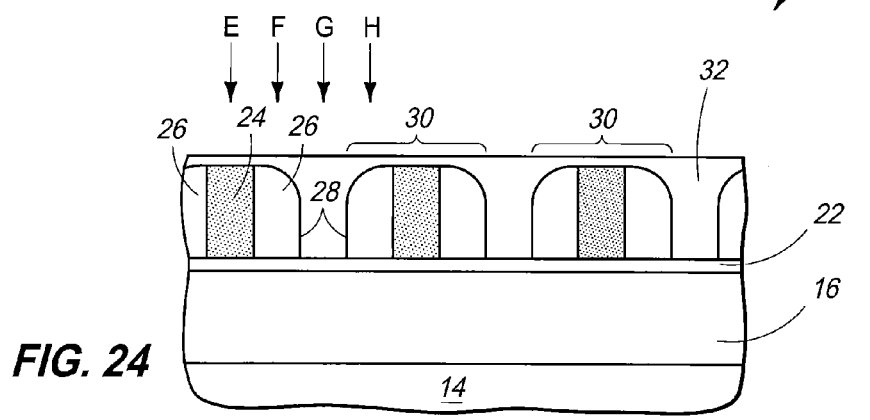
FIG. 24 is a cross sectional view taken through line 24-24 in FIG. 22.

Referring to FIGS. 22-24, second fill material 32 is provided to be received laterally between second sidewall spacers 28 of laterally adjacent second features 30. Such may be of the same or different composition(s) as first fill material 22. Further, such may have any of the same attributes described above with respect to first fill material 22, including by way of example only those with respect to the second spacers and second lines as the first fill material may have with respect to the first spacers and first lines.

Figure 25:
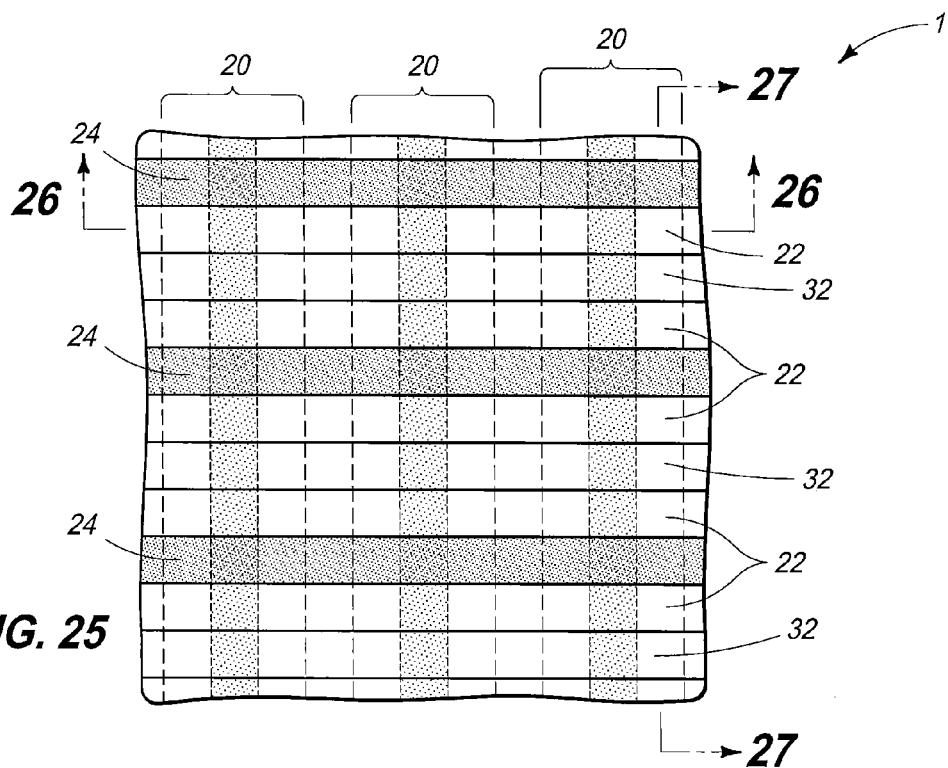
FIG. 25 is a view of the FIG. 22 substrate at a processing step subsequent to that shown by FIG. 22.
Figure 26:
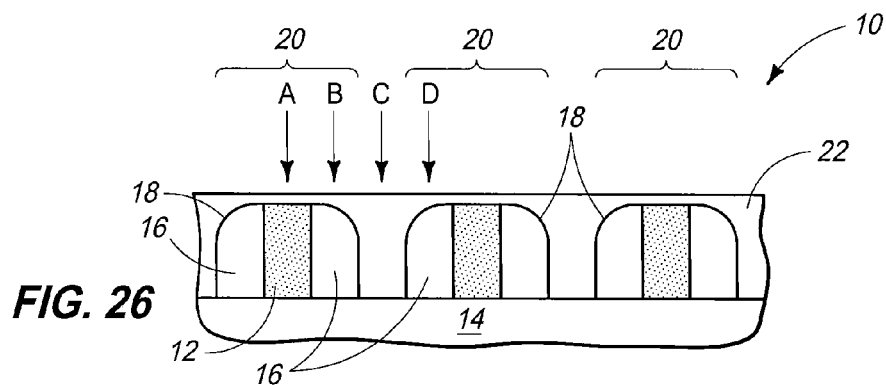
FIG. 26 is a cross sectional view taken through line 26-26 in FIG. 25.
Figure 27:
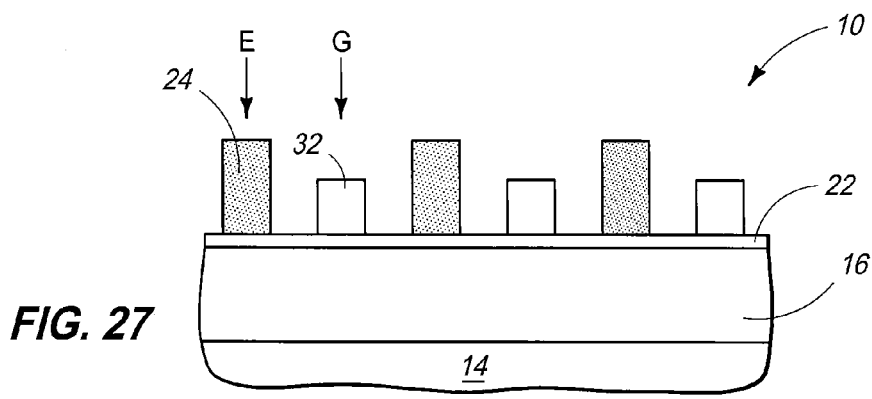
FIG. 27 is a cross sectional view taken through line 27-27 in FIG. 25.

Referring to FIGS. 25-27, second fill material 32 has been removed sufficiently to at least expose elevationally outermost surfaces of second sidewall spacers 28 (not shown), with such spacers thereafter having been removed. The act of removing the second sidewall spacers may or may not expose underlying first sidewall spacers 18, with such not being exposed in FIGS. 25 and 26 due to first fill material 22 being received thereover. Ideally, removal of the second sidewall spacers from between the second lines and the second fill material is conducted by a selective anisotropic etch. In the context of this document, a "selective etch" denotes removal of one material relative to another at a removal rate of at least 1.5:1.

Figure 28:
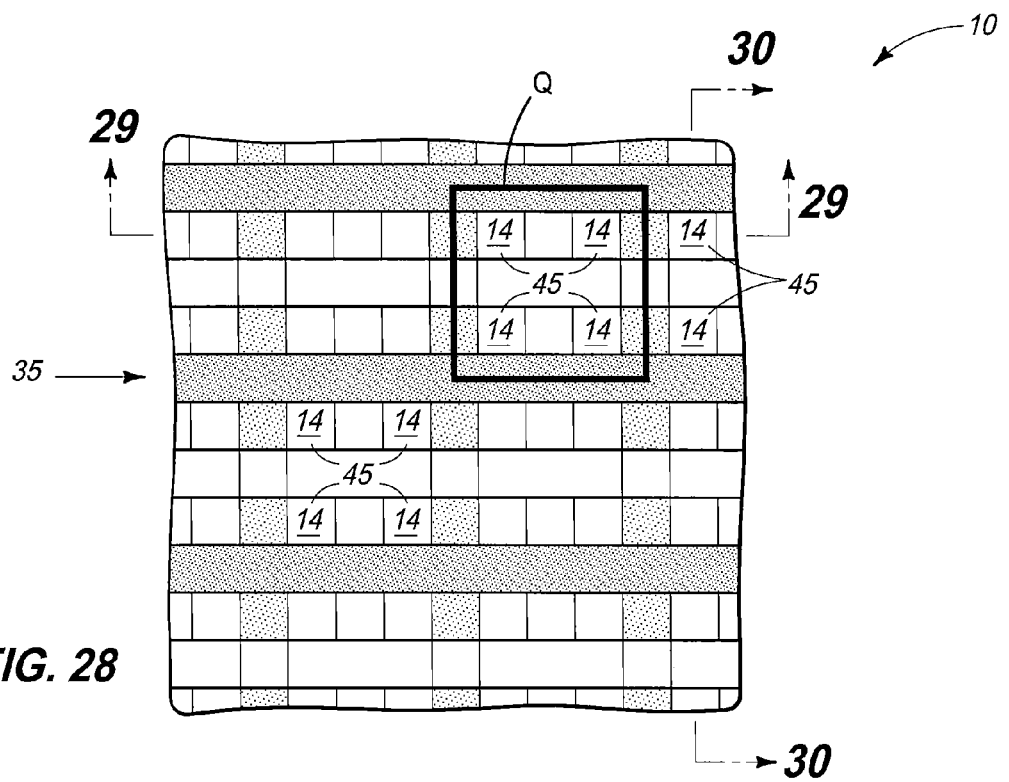
FIG. 28 is a view of the FIG. 25 substrate at a processing step subsequent to that shown by FIG. 25.
Figure 29:
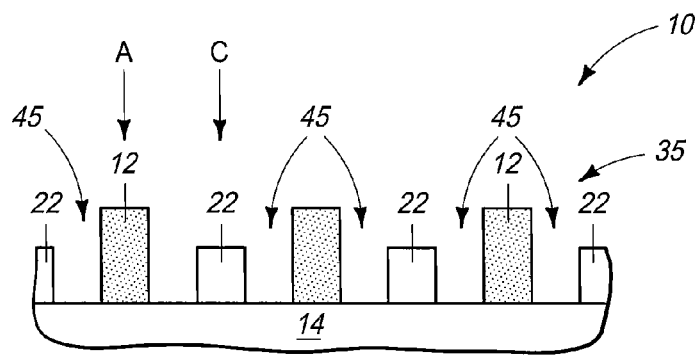
FIG. 29 is a cross sectional view taken through line 29-29 in FIG. 28.
Figure 30:
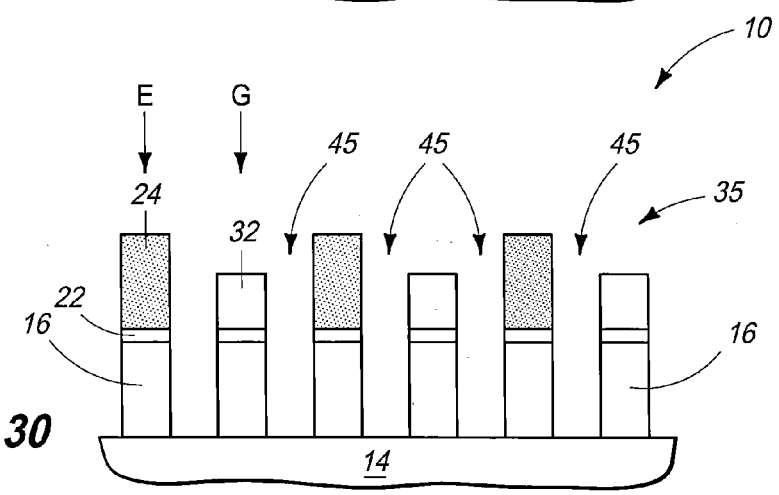
FIG. 30 is a cross sectional view taken through line 30-30 in FIG. 28.

Referring to FIGS. 28-30, first fill material 22 has been removed at least where covering underlying first sidewall spacers 18 and first lines 12. Subsequently, portions of first sidewall spacers 18 (not shown) have been removed from between first lines 12 and first fill material 22 that are not covered by second lines 24 and second fill material 32. Such may be conducted ideally by a selective anisotropic etch relative to the first lines, the first fill material, the second lines, and the second fill material. Regardless, FIGS. 28-30 show an example pattern 35 comprising a plurality of openings 45.

Figure 31:
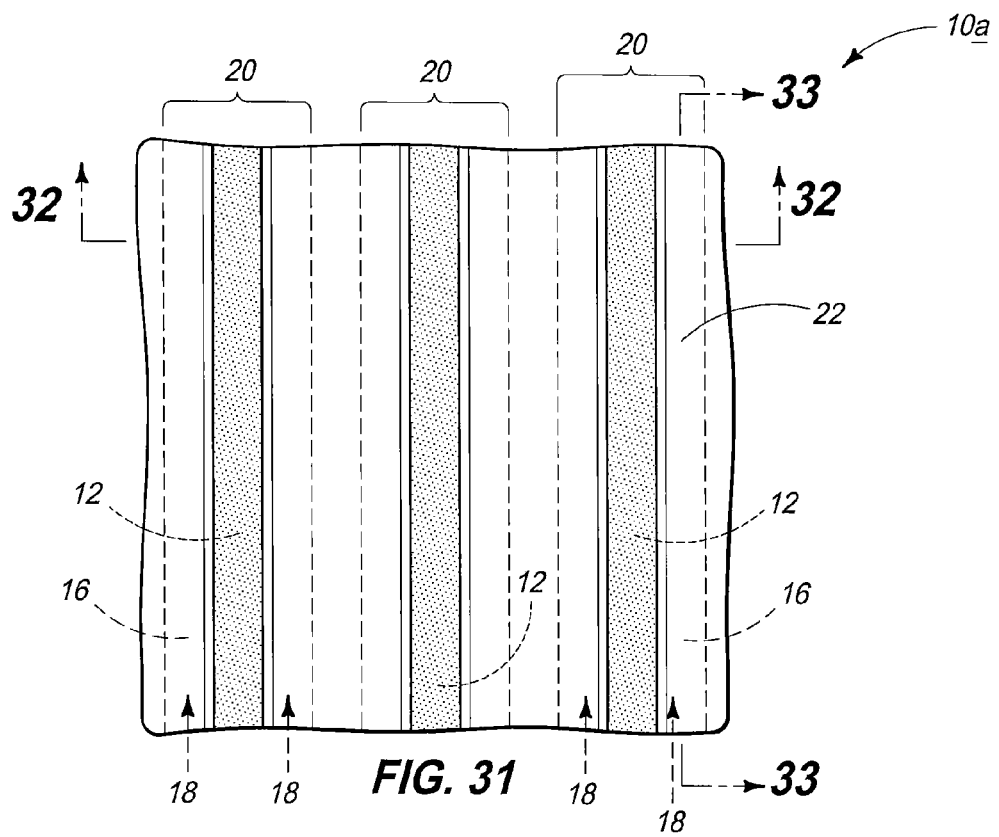
FIG. 31 is a diagrammatic top view of a substrate in process in accordance with an embodiment of the invention.
Figure 32:
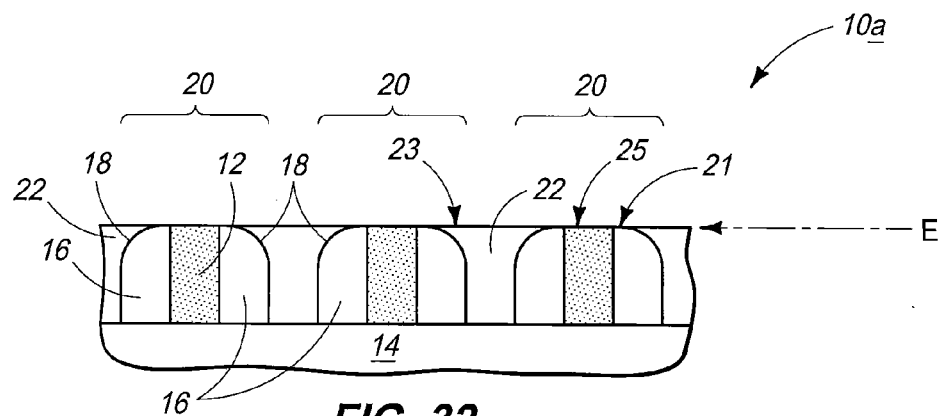
FIG. 32 is a cross sectional view taken through line 32-32 in FIG. 31.
Figure 33:
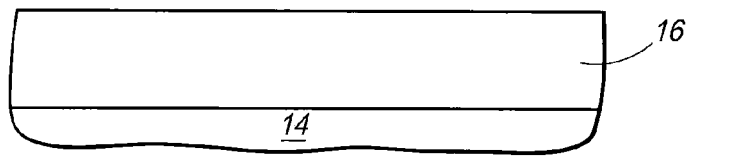
FIG. 33 is a cross sectional view taken through line 33-33 in FIG. 31.

In the above-depicted embodiment, first fill material 22 was formed to have an elevationally outer surface that was elevationally outward of elevationally outermost surfaces 21 of first sidewall spacers 18 (see FIGS. 10-12). An alternate example is shown in FIGS. 31-33 with respect to a substrate fragment 10a. Like numerals from the above-described embodiment have been used. FIGS. 31-33 show first fill material 22 as having been formed to have its elevationally outermost surface 23 to be elevationally coincident with elevationally outermost surfaces 21 of first sidewall spacers 18 (FIG. 32). Additionally, surface 23 is elevationally coincident with first line outer surfaces 25. Further, outermost surfaces 21 of first sidewall spacers 18 are at a common elevation "E", with elevationally outermost surface 23 of first fill material 22 being planar and elevationally coincident with outermost surfaces 21 of first sidewall spacers 18.

Figure 34:
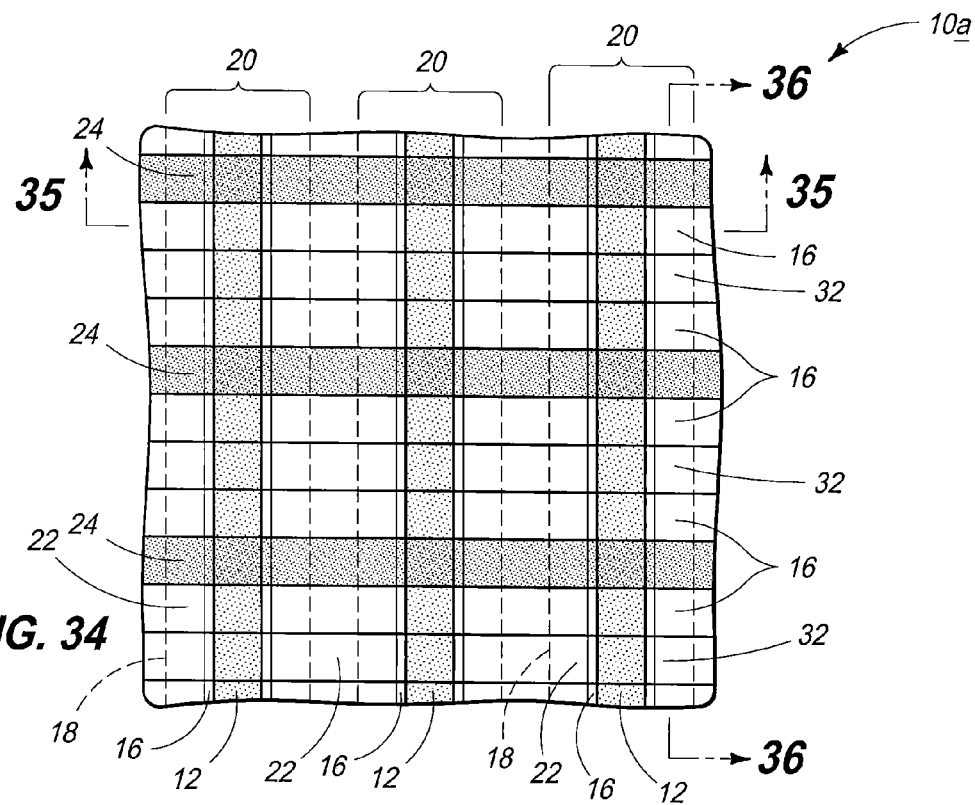
FIG. 34 is a view of the FIG. 31 substrate at a processing step subsequent to that shown by FIG. 31.
Figure 35:
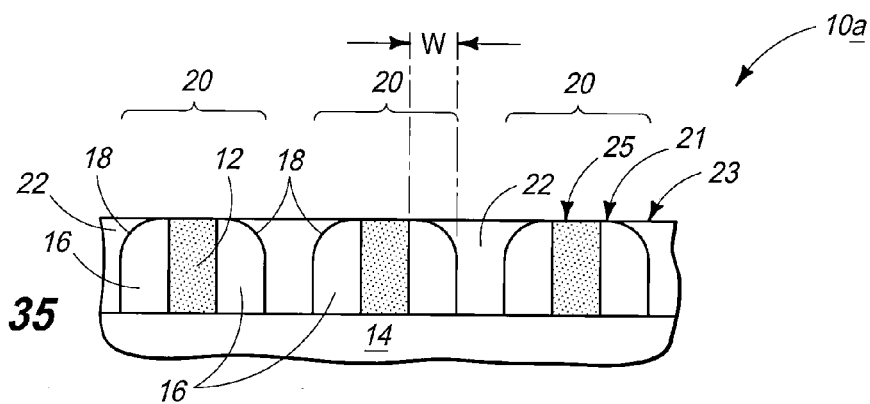
FIG. 35 is a cross sectional view taken through line 35-35 in FIG. 34.
Figure 36:
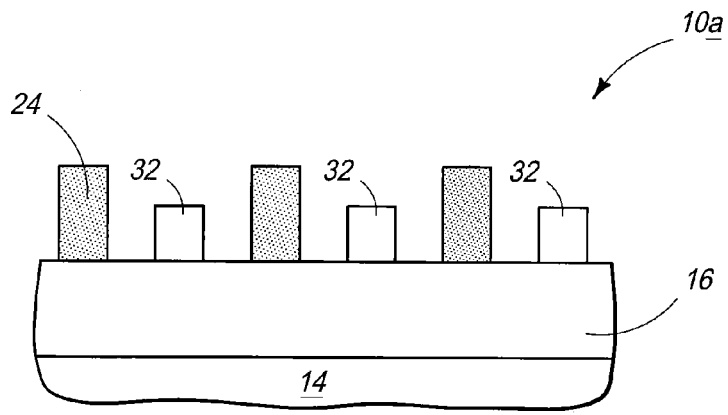
FIG. 36 is a cross sectional view taken through line 36-36 in FIG. 34.

FIGS. 34-36 correspond in processing sequence to FIGS. 25-27 of the first-described embodiments. Second sidewall spacers 28 (not shown) have been removed from between second lines 24 and second fill material 32 whereby underlying portions of first sidewall spacers 18 have been exposed. Such removal has exposed only some of the lateral width "W" of respective first sidewall spacers 18 due to, for example, the depicted upper surfaces of first spacers 18 curving or tapering laterally outward and elevationally inward.

Figure 37:
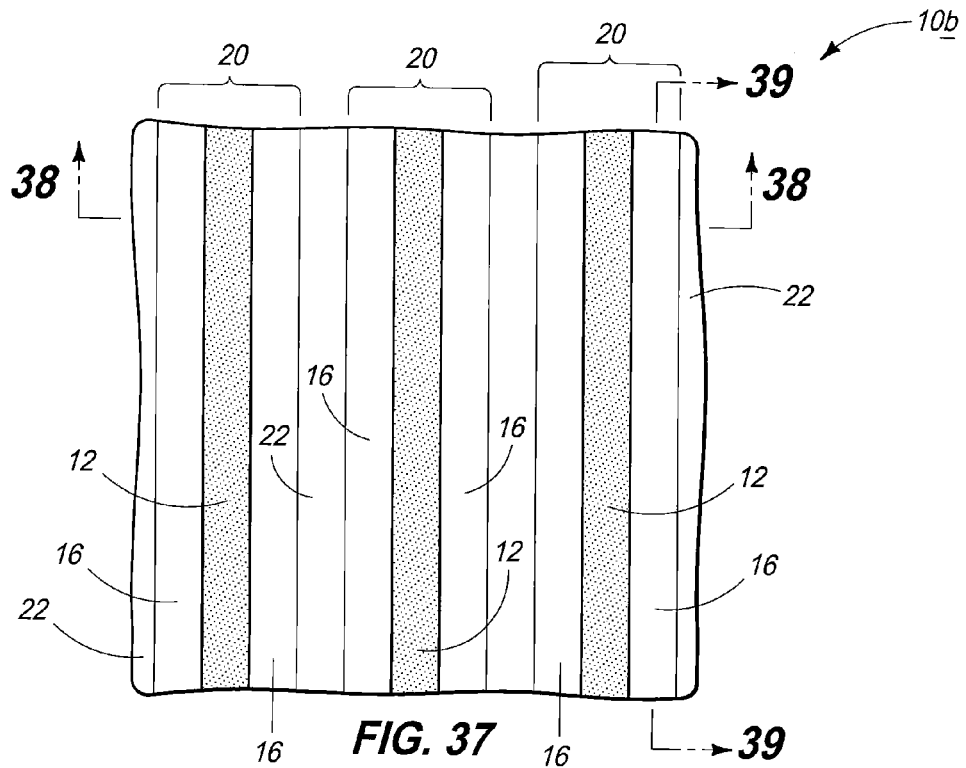
FIG. 37 is a diagrammatic top view of a substrate in process in accordance with an embodiment of the invention.
Figure 38:
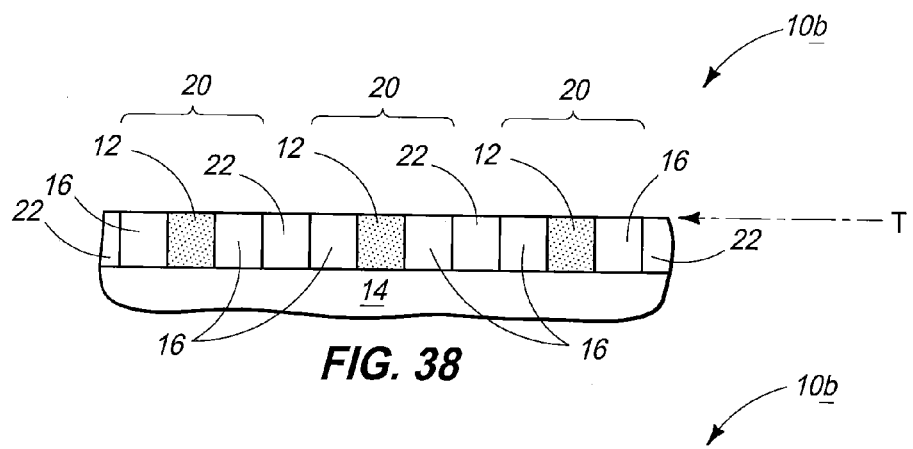
FIG. 38 is a cross sectional view taken through line 38-38 in FIG. 37.
Figure 39:
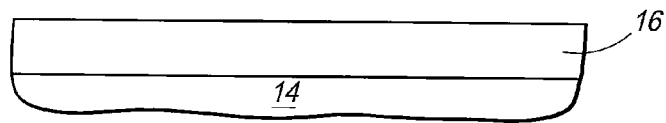
FIG. 39 is a cross sectional view taken through line 39-39 in FIG. 37.

Another and/or alternate example embodiment is described with reference to a substrate fragment 10b with reference to FIGS. 37-39. Like numerals from the above-described embodiments have been used. FIGS. 37-39 correspond in processing sequence as would occur immediately subsequent to that of FIGS. 10-12 or FIGS. 31-32 in the above-described embodiments. Specifically with respect to the substrate of FIGS. 10-12, first lines 12, first sidewall spacers 18, and first fill material 22 have been planarized elevationally inward to a co-planar elevationally outermost surface T. Processing may occur subsequently in any of the manners described above. Further if, for example, the second sidewall spacers are subsequently formed directly against first spacers 18, removal thereof may inherently expose portions of first sidewall spacers 18. In this document, a material or structure is "directly against" another when there is at least some physical touching contact of the stated materials or structures relative one another. In contrast, "over" encompasses "directly against" as well as constructions where intervening material(s) or structure(s) result(s) in no physical touching contact of the stated materials or structures relative one another.

Figure 40:
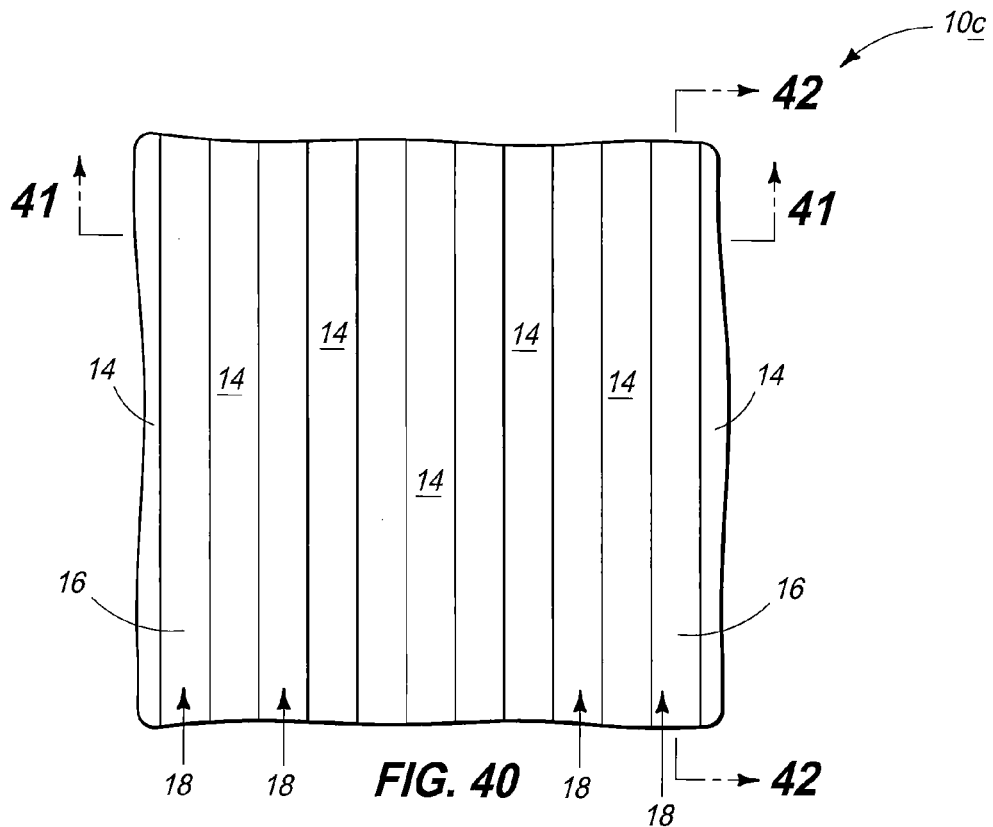
FIG. 40 is a diagrammatic top view of a substrate in process in accordance with an embodiment of the invention.
Figure 41:
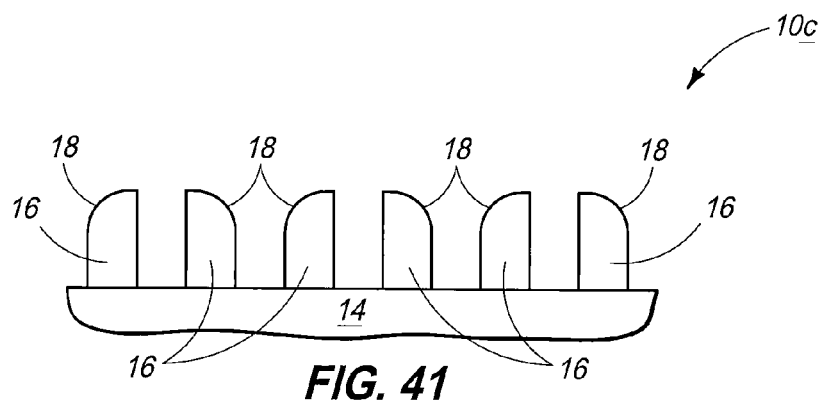
FIG. 41 is a cross sectional view taken through line 41-41 in FIG. 40.
Figure 42:
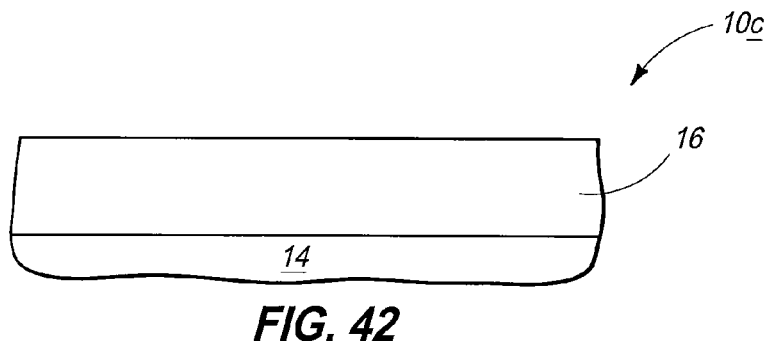
FIG. 42 is a cross sectional view taken through line 42-42 in FIG. 40.

Another example embodiment of a method of forming a pattern on a substrate is described with reference to FIGS. 40-45 with respect to a substrate fragment 10c. Like numerals from the above-described embodiments have been used. In the above embodiments at the processing of FIGS. 10-12 and 31-33, original first lines 12 remain prior to deposition of first fill material 22. However as another example, some or all of such original line material may be removed. Specifically, FIGS. 7-9 may be considered as depicting formation of spaced longitudinally elongated lines 12 having first sidewall spacers 18 formed longitudinally along sidewalls thereof. FIGS. 40-42 show removal of such spaced lines (not shown) from between first sidewall spacers 18.

Figure 43:
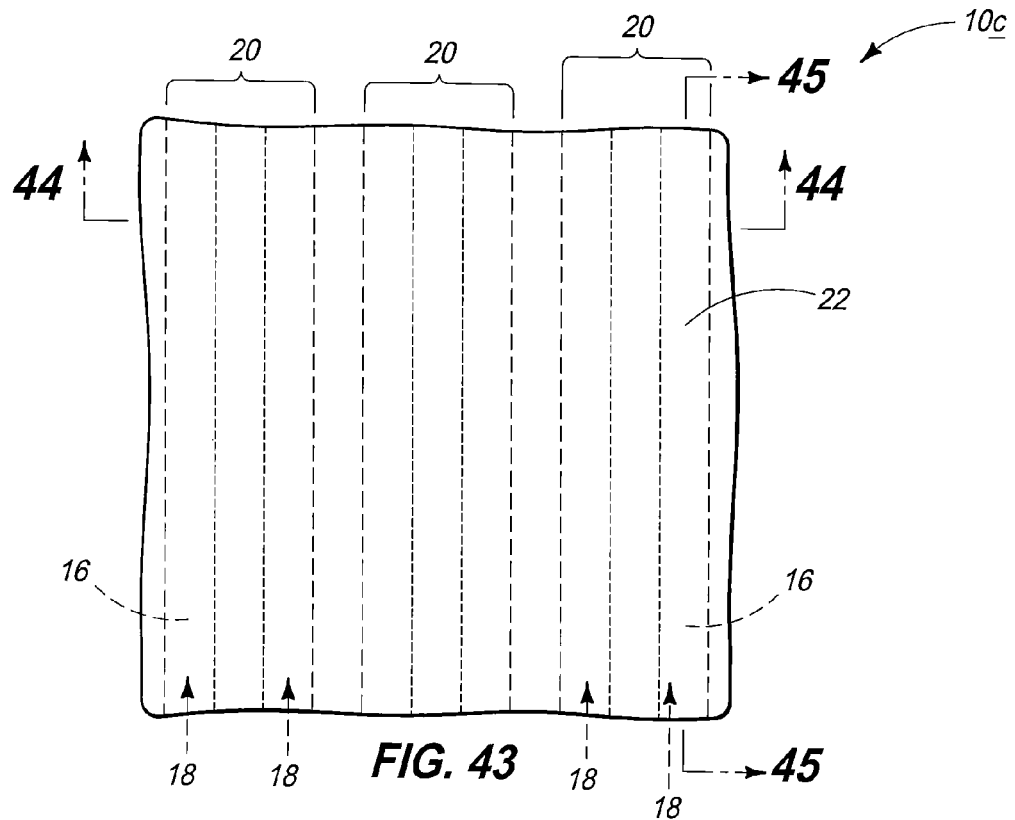
FIG. 43 is a view of the FIG. 40 substrate at a processing step subsequent to that shown by FIG. 40.
Figure 44:
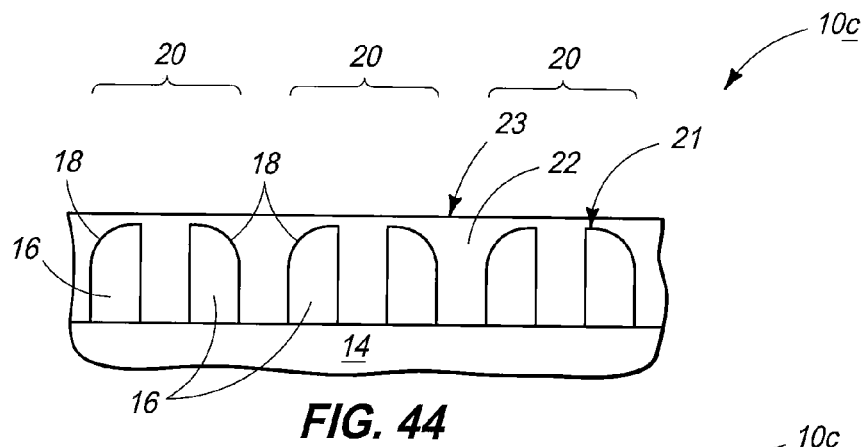
FIG. 44 is a cross sectional view taken through line 44-44 in FIG. 43.
Figure 45:
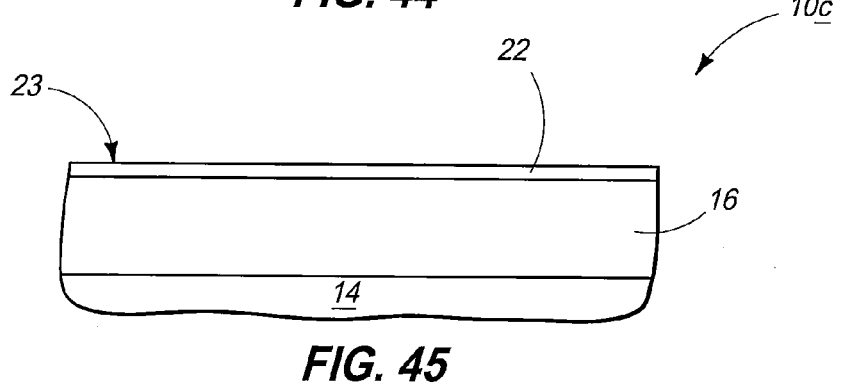
FIG. 45 is a cross sectional view taken through line 45-45 in FIG. 43.

In FIGS. 43-45, first fill material 22 has been deposited over first sidewall spacers 18, laterally between first sidewall spacers 18 where the removed spaced lines (not shown) were, and laterally between first sidewall spacers 18 of laterally adjacent first features 20. Any alternate or additional processing with respect to each of the above-described embodiments may further and/or alternately occur. As examples only, the first material may be planarized back to at least the elevationally outermost surfaces of the first spacers, or further elevationally inward to provide a co-planar elevationally outermost surface of the first lines, first sidewall spacers, and first fill material. Regardless, processing may occur subsequently in any of the example manners described above, or otherwise.

Further, the processing as just-described with respect to FIGS. 40-45 may alternately or additionally be conducted relative to formation of the second features. For example, formation of the second features may comprise forming spaced longitudinally elongated lines having second sidewall spacers received longitudinally along sidewalls thereof. Some or all of such spaced lines may be removed from between the second sidewall spacers. Thereafter, second fill material may be deposit over the second sidewall spacers, laterally between the second sidewall spacers where the removed space lines were, and laterally between the second sidewall spacers of laterally adjacent second features.

Any other combination of processing and construction attributes with respect to the above embodiments may be combined.

Figure 46:
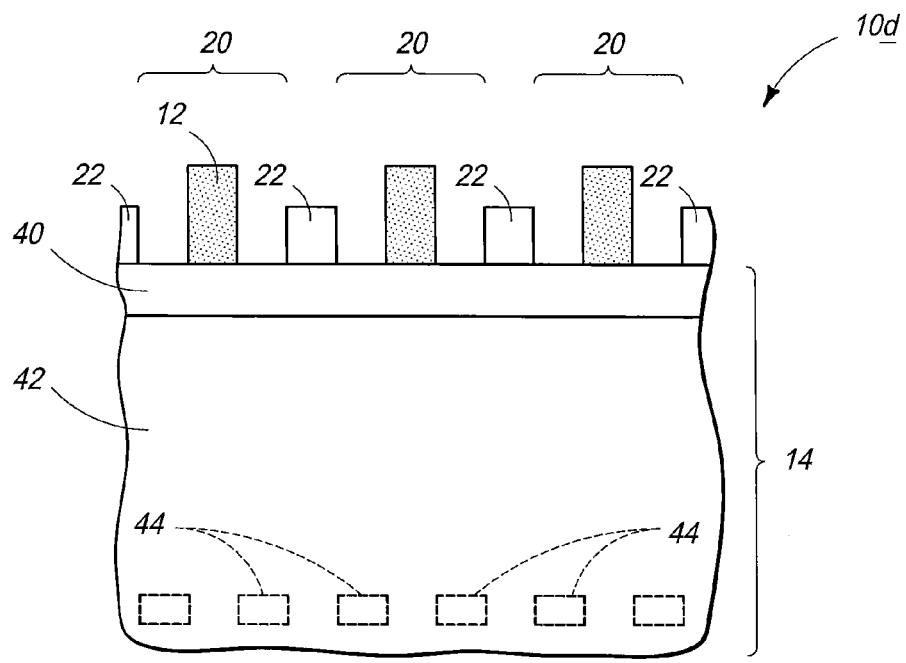
FIG. 46 is a diagrammatic cross sectional view of an alternate substrate to that of FIG. 29 which is in process in accordance with an embodiment of the invention.
Figure 47:
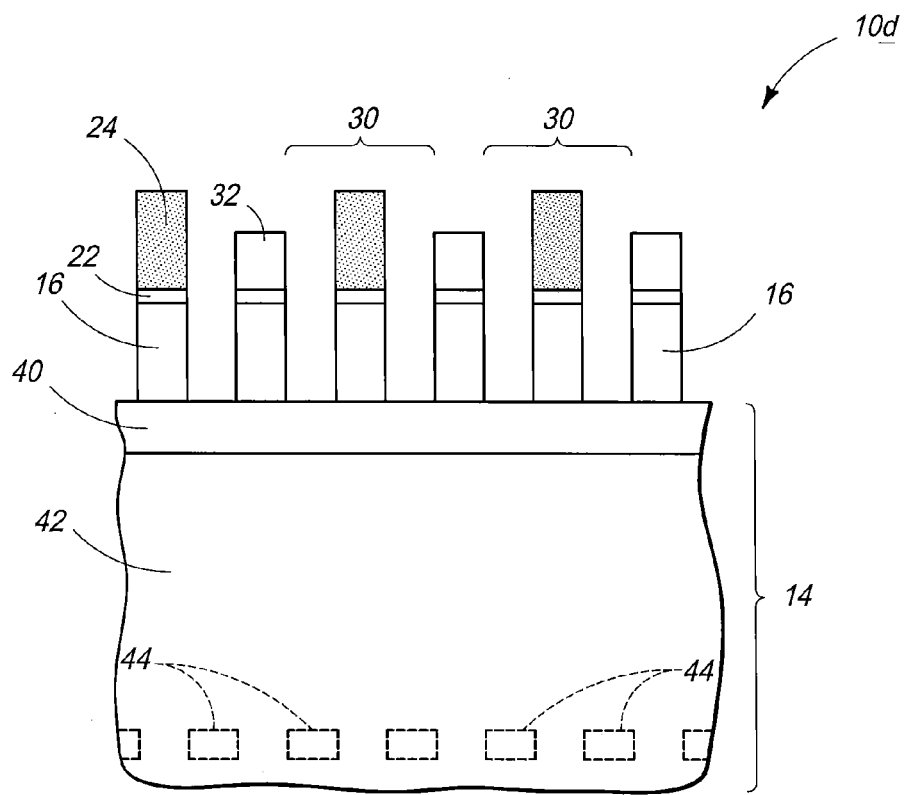
FIG. 47 is view of the FIG. 46 substrate corresponding in cross sectional cut location to that of FIG. 30.

Integrated circuitry components and/or other structures may be formed using, or may comprise, some or all of example pattern 35 (FIGS. 28-30) formed on a substrate. Alternately or additionally, such pattern may be used as a mask for subsequent processing of substrate material therebeneath. In one example embodiment after removing the portions of the first sidewall spacers to the underlying substrate, the underlying substrate may be etched into using remnant of the first and second features and the first and second fill materials as a mask. In one embodiment, a plurality of contact openings are formed which extend to node locations in the underlying substrate. One such example embodiment is described with reference to FIGS. 46-52. FIGS. 46 and 47 show a substrate fragment 10d the same as that of FIGS. 35 and 36, respectively, except for underlying substrate 14 as comprising a suitable outer hardmask material 40 formed over underlying material 42. Materials 40 and 42, respectively, may be homogenous or non-homogenous, for example comprising multiple different composition materials and/or layers. Example node locations 44 are shown within material 42. Regardless, the depicted remnant of first features 20, of second features 30, of first fill material 22, and of second fill material 32 may be considered as comprising an example first mask.

Figure 48:
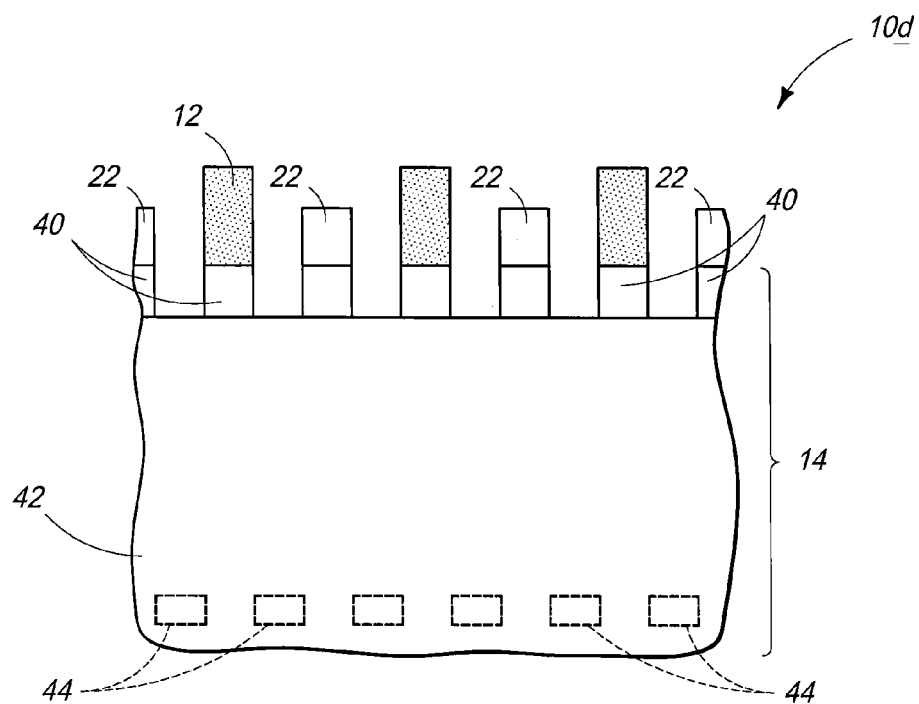
FIG. 48 is a view the FIG. 46 substrate at a processing step subsequent to that shown by FIG. 46.
Figure 49:
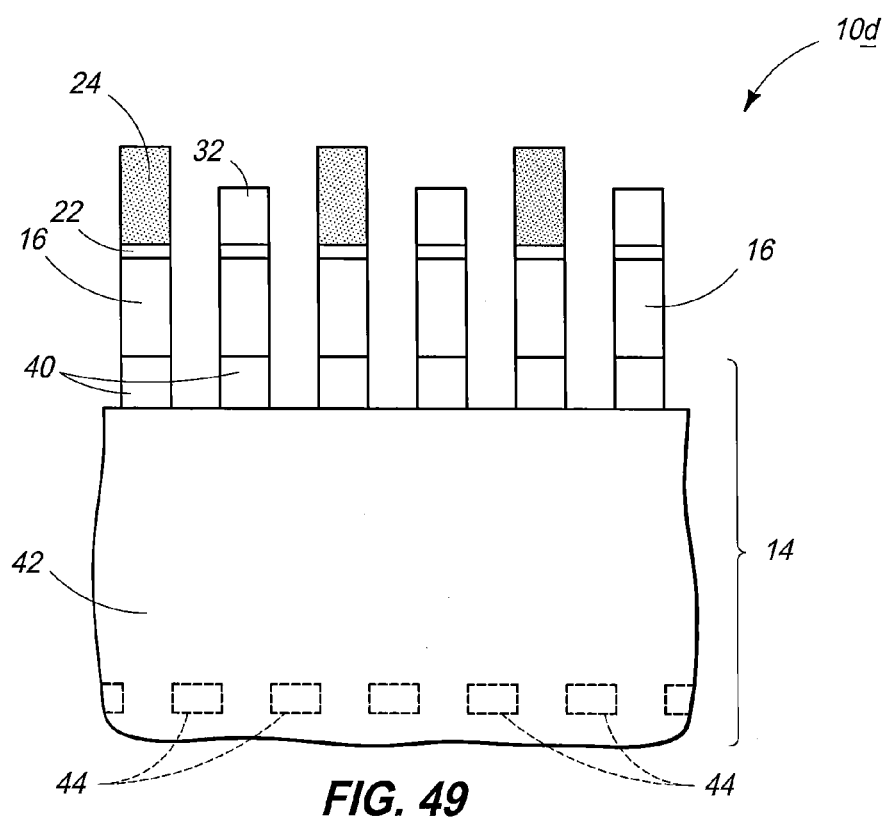
FIG. 49 is a view the FIG. 47 substrate at a processing step subsequent to that shown by FIG. 47.

Referring to FIGS. 48 and 49, such first mask has been used to form a contact opening pattern into hardmask material 40 by etching through openings in such first mask. Some, all, or none of the first mask may remain after the etching to form the depicted contact opening pattern in hardmask material 40. Further if any is remaining, such may be removed subsequently.

Figure 50:
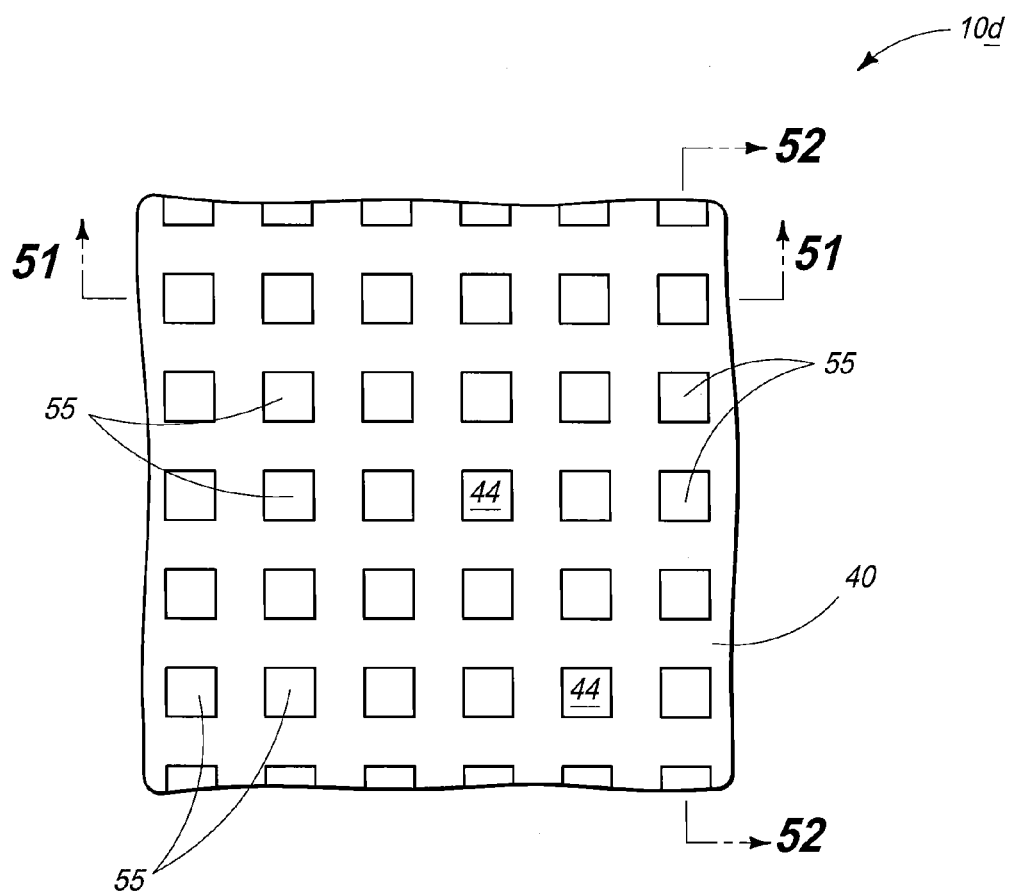
FIG. 50 is a diagrammatic top view of the FIGS. 48 and 49 substrate at a processing step subsequent to that shown by FIGS. 48 and 49.
Figure 51:
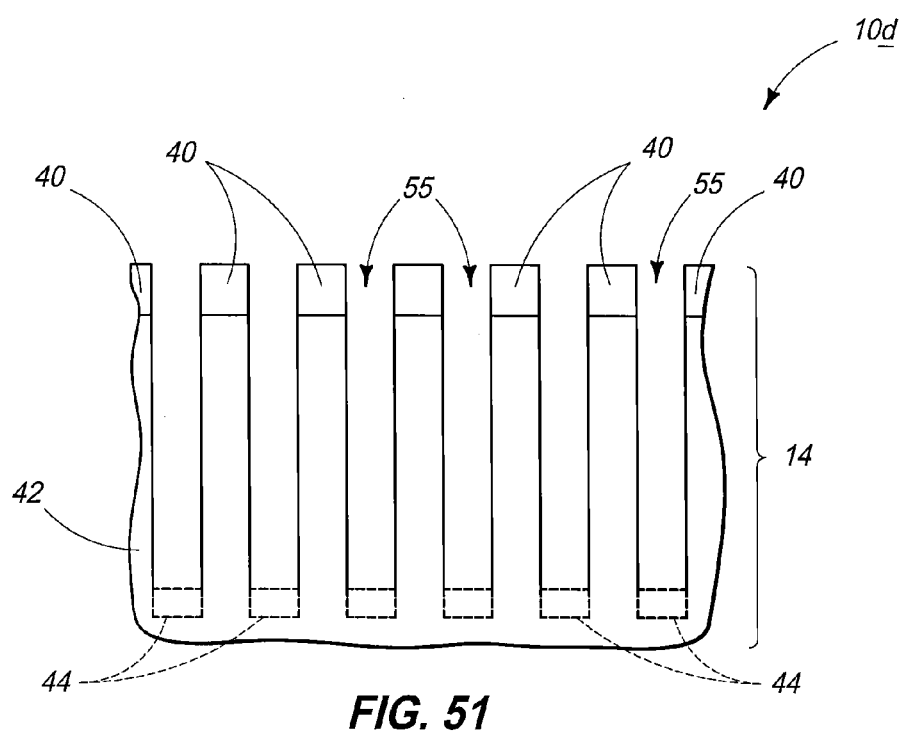
FIG. 51 is a cross sectional view taken through line 51-51 in FIG. 50.
Figure 52:
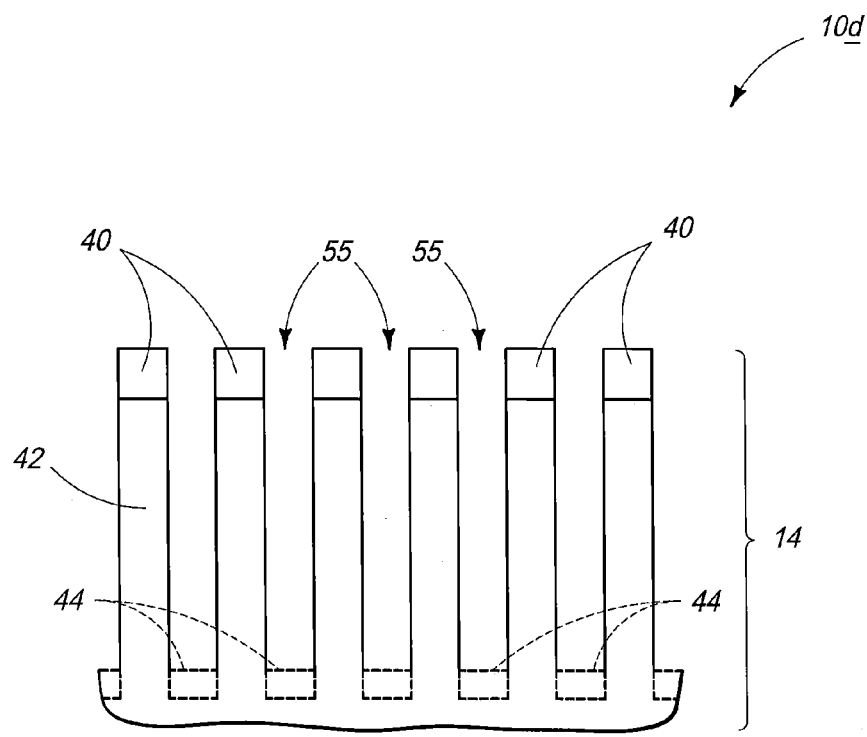
FIG. 52 is a cross sectional view taken through line 52-52 in FIG. 50.

Referring to FIGS. 50-52, a plurality of contact openings 55 has been etched into substrate material 42 using the contact opening pattern in hardmask material 40 as a second mask. Some, all, or none of the first mask (not shown) may remain after the FIGS. 50-52 etching if any remained over material 40 at the start of the FIGS. 50-52 etching.

In one embodiment, a method of forming a pattern on a substrate includes forming anisotropically etched first sidewall spacers elevationally over an underlying substrate. The above-described processing through FIG. 9 is but one example embodiment, and regardless of material or structure being received between first sidewall spacers 18. Anisotropically etched second sidewall spacers are formed elevationally over and cross the first sidewall spacers, and regardless of whether material is received between the first sidewall spacers when the anisotropically etched second spacers are formed. Intersections of the first and second sidewall spacers define respective elevationally overlapped areas of the first sidewall spacers where the second sidewall spacers cross over the first sidewall spacers. Processing as described above is but one such example embodiment wherein such example elevationally overlapped areas are designated with arrows 75 in the FIG. 19 embodiment, and regardless of whether material or structure is received between any of the first sidewall spacers or any of the second sidewall spacers.

The second sidewall spacers are removed where such cross over the first sidewall spacers and the overlapped areas of the first sidewall spacers are exposed. Such occurs regardless of the presence of fill or other material between any of the first and second sidewall spacers. Further, the removal of the second sidewall spacers may remove all of such or only some of such from the substrate. Regardless, material of the first sidewall spacers is removed through the exposed overlapped areas to the underlying substrate while at least a majority of the area of the first sidewall spacers outside of the overlapped areas is masked. By way of example only, FIGS. 28-30 show example such removal of material of first sidewall spacers 18 (not shown). Alternate and/or additional processing may otherwise occur as described above. For example and by way of example only, the second sidewall spacers may be formed directly against the first sidewall spacers, and the act of removing of the second sidewall spacers may inherently expose the overlapped areas of the first sidewall spacers. Alternately, the second sidewall spacers may not be formed directly against the first sidewall spacers, and the removing of the second sidewall spacers may not in such instance expose the overlapped areas of the first sidewall spacers. As an additional example, the elevationally outermost surfaces of the first sidewall spacers may initially be non-planar as formed. Such may subsequently be planarized prior to forming the second sidewall spacers.

In one embodiment, a method of forming a pattern on a substrate includes forming a repeating pattern of four first lines elevationally over an underlying substrate. For example and by way of example only with respect to the embodiments of FIGS. 1-30, four example first lines A, B, C, and D are shown in FIGS. 10, 11, and 26 as an example repeating pattern formed over an underlying substrate. A repeating pattern of four second lines is formed elevationally over and cross the repeating pattern of four first lines. By way of example only, such example repeating four second lines E, F, G, and H are shown in FIGS. 22 and 24.

First alternating ones of the four second lines are removed from being received over the first lines. By way of example only with respect to FIGS. 25 and 27, alternating second lines F and H (not shown) constitute such an example first alternating ones of such second lines which have been removed from being received over first lines A, B, C, and D. Subsequently, elevationally exposed portions of alternating ones of the four first lines are removed to the underlying substrate using a remaining second alternating of the four second lines as a mask. By way of example only, the processing of FIGS. 28-30 depicts one such example embodiment. For example, elevationally exposed portions of alternating first lines B and D (not shown) of the four first lines A, B, C, and D have been removed to underlying substrate 14 using a remaining second alternating ones E and G of the four second lines as a mask. Any alternate and/or additional processing as described above may be used.

In one embodiment, a method of forming a pattern on a substrate includes forming first and second lines elevationally over an underlying substrate. By way of example only, an immediately adjacent pair of two lines A in FIG. 10 constitute but example such first and second lines. Third and fourth lines are formed elevationally over and cross the first and second lines; with the first, second, third, and fourth lines forming a quadrilateral there-between. For example, with reference to FIG. 22, any immediately adjacent pair of two lines E constitutes an example such third and fourth lines which have been formed elevationally over and cross first lines A, A. An example quadrilateral Q is shown formed between/among such crossing lines. Any quadrilateral may be formed, including parallelograms, trapezoids, rectangles, squares, etc., with a square Q being shown in FIG. 22.

A pair of crossing lines is provided within the quadrilateral. For example with respect to quadrilateral Q, lines C and G formed therein constitutes an example pair of crossing lines. Such lines may be centered within the quadrilateral, otherwise positioned within the quadrilateral, and/or need not cross orthogonally relative one another.

The first, second, third, fourth, and the pair of crossing lines are used as a mask while etching through material to form a pattern of four openings which are individually received within a respective different one of four corners of the quadrilateral. For example and by way of example only with respect to the FIGS. 1-30 embodiment, an example four openings 45 (FIG. 28) are shown with respect to a quadrilateral Q and which are individually received within a respective different one of the four corners of such.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a pattern on a substrate, comprising:
    forming first features elevationally over an underlying substrate, the first features comprising longitudinally elongated first lines having first sidewall spacers received longitudinally along opposite sides thereof, first fill material being received laterally between the first sidewall spacers of laterally adjacent first features;
    forming second features elevationally over and crossing the first features, the second features comprising longitudinally elongated second lines having second sidewall spacers received longitudinally along opposite sides thereof, second fill material being received laterally between the second sidewall spacers of laterally adjacent second features;
    removing the second sidewall spacers from between the second lines and the second fill material; and
    removing, to the underlying substrate, portions of the first sidewall spacers from between the first lines and the first fill material that are not covered by the second lines and the second fill material.

2. The method of claim 1 comprising after removing the portions of the first sidewall spacers to the underlying substrate, etching into the underlying substrate using remnant of the first and second features and the first and second fill materials as a mask and forming a plurality of contact openings extending to node locations in the underlying substrate.

3. The method of claim 2 wherein the underlying substrate comprises an outer hardmask material, the etching comprising:
    etching a contact opening pattern into the hardmask material using the remnant of the first and second features and the first and second fill materials as a first mask; and
    etching the plurality of the of contact openings into substrate material underlying the hardmask material using the contact opening pattern in the hardmask material as a second mask.

4. The method of claim 3 comprising etching the first mask away from over the hardmask material.

5. The method of claim 1 wherein the first fill material and the first lines are formed to be of different compositions.

6. The method of claim 1 wherein the first fill material and the first lines are formed to be of the same composition.

7. The method of claim 1 wherein the first fill material is formed to have an elevationally outermost surface that is elevationally coincident with or elevationally outward of elevationally outermost surfaces of the first sidewall spacers.

8. The method of claim 7 wherein the elevationally outermost surface of the first fill material is planar.

9. The method of claim 8 wherein the elevationally outermost surfaces of the first sidewall spacers are at a common elevation, the elevationally outermost surface of the first fill material being elevationally coincident with the elevationally outermost surfaces of the first sidewall spacers.

10. The method of claim 8 wherein the elevationally outermost surface of the first fill material is elevationally outward of the elevationally outermost surfaces of the first spacers.

11. The method of claim 1 wherein forming the first features over which the second features are formed comprises planarizing the first lines, the first sidewall spacers, and the first fill material elevationally inward to a coplanar elevationally outermost surface of the first lines, the first sidewall spacers, and the first fill material.

12. The method of claim 1 wherein removing the second sidewall spacers exposes underlying portions of the first sidewall spacers.

13. The method of claim 12 wherein removing the second sidewall spacers exposes all of the lateral width of the respective first sidewall spacers.

14. The method of claim 12 wherein removing the second sidewall spacers exposes only some of the lateral width of the respective first sidewall spacers.

15. The method of claim 1 wherein removing the second sidewall spacers does not expose the underlying first sidewall spacers.

16. The method of claim 1 wherein forming the first features comprises:
forming spaced longitudinally elongated lines;
forming the first sidewall spacers longitudinally along sidewalls of the spaced lines;
removing the spaced lines from between the first sidewall spacers; and
depositing the first fill material over the first sidewall spacers, laterally between the first sidewall spacers where the removed spaced lines were, and laterally between the first sidewall spacers of laterally adjacent first features.

17. The method of claim 16 comprising planarizing at least the first fill material back to at least the elevationally outermost surfaces of the first spacers.

18. The method of claim 17 comprising planarizing the first fill material and the first spacers elevationally inward to a coplanar elevationally outermost surface of the first lines, the first sidewall spacers, and the first fill material.

19. The method of claim 1 wherein the first and second features cross orthogonally relative one another.

20. The method of claim 1 wherein the first and second features cross non-orthogonally relative one another.

21. The method of claim 1 wherein the first and second features extend longitudinally straight linear.

22. The method of claim 1 wherein at least one of the collective first features and the collective second features respectively extend longitudinally curvilinear.

23. The method of claim 1 wherein the first fill material and the second fill material are of the same composition.

24. The method of claim 1 wherein the first fill material and the second fill material are of different compositions.

25. The method of claim 1 wherein the first fill material is received elevationally over the first lines and the first sidewall spacers, and over which the second features are formed; and
after removing the second sidewall spacers, etching the first fill material to expose the first sidewall spacers and first lines there-beneath.

26. The method of claim 1 wherein the removing of the portions of the first sidewall spacers comprises anisotropic etching of material of the first sidewall spacers selectively relative to the first lines, the first fill material, the second lines, and the second fill material.

27. The method of claim 1 wherein forming the second features comprises:
forming spaced longitudinally elongated lines;
forming the second sidewall spacers longitudinally along sidewalls of the spaced lines;
removing the spaced lines from between the second sidewall spacers; and
depositing the second fill material over the second sidewall spacers, laterally between the second sidewall spacers where the removed spaced lines were, and laterally between the second sidewall spacers of laterally adjacent second features.

28. A method of forming a pattern on a substrate, comprising:
forming anisotropically etched first sidewall spacers elevationally over an underlying substrate;
forming anisotropically etched second sidewall spacers elevationally over and crossing the first sidewall spacers, intersections of the first and second sidewall spacers defining respective elevationally overlapped areas of the first sidewall spacers where the second sidewall spacers cross over the first sidewall spacers;
removing the second sidewall spacers where such cross over the first sidewall spacers and exposing the overlapped areas of the first sidewall spacers; and
removing material of the first sidewall spacers through the exposed overlapped areas to the underlying substrate while at least a majority of the area of the first sidewall spacers outside of the overlapped areas is masked.

29. The method of claim 28 wherein the second sidewall spacers are formed directly against the first sidewall spacers, and the removing of the second sidewall spacers exposes the overlapped areas of the first sidewall spacers.

30. The method of claim 28 wherein the second sidewall spacers are not formed directly against the first sidewall spacers, and the removing of the second sidewall spacers does not expose the overlapped areas of the first sidewall spacers.

31. The method of claim 28 wherein elevationally outermost surfaces of the first sidewall spacers are non-planar, and comprising planarizing the elevationally outermost surfaces of the first sidewall spacers prior to forming the second sidewall spacers.

32. The method of claim 28 wherein the removing of the second sidewall spacers removes all of such from the substrate.

33. A method of forming a pattern on a substrate, comprising:
forming a repeating pattern of four first lines elevationally over an underlying substrate;
forming a repeating pattern of four second lines elevationally over and crossing the repeating pattern of four first lines, each of the second lines comprising solid material;
after forming the first lines and the second lines, removing first alternating second lines of the four second lines from being received over the first lines; and
after removing the first alternating second lines of the four second lines, removing elevationally exposed portions of alternating first lines of the four first lines to the underlying substrate using a remaining second alternating of the four second lines as a mask.

34. A method of forming a pattern on a substrate, comprising:
forming first and second lines elevationally over an underlying substrate;
forming third and fourth lines elevationally over and crossing the first and second lines; the third and fourth lines each comprising solid material;
the first, second, third, and fourth lines forming a quadrilateral there-between;
providing a pair of crossing lines within the quadrilateral, the crossing lines each comprising solid material; and
using the first line, the second line, the third line, the fourth line, and the pair of crossing lines as a mask while etching through material to form a pattern of four openings which are individually received within a respective different one of four corners of the quadrilateral.

35. The method of claim 34 comprising providing the pair of crossing lines to be centered within the quadrilateral.

\* \* \* \* \*

UNITED STATES PATENT AND TRADEMARK OFFICE
CERTIFICATE OF CORRECTION

Page 1 of 1

PATENT NO. : 8,575,032 B2
APPLICATION NO. : 13/101485
DATED : November 5, 2013
INVENTOR(S) : Scott L. Light et al.

It is certified that error appears in the above-identified patent and that said Letters Patent is hereby corrected as shown below:

In the Claims

In column 10, line 29, in Claim 3, before "contact" delete "the of".

Signed and Sealed this
Twenty-fifth Day of February, 2014

Michelle K. Lee
*Deputy Director of the United States Patent and Trademark Office*